(12) United States Patent
Marxer et al.

(10) Patent No.: US 6,673,255 B2
(45) Date of Patent: Jan. 6, 2004

(54) PLASMA TREATMENT APPARATUS AND METHOD FOR OPERATING SAME

(75) Inventors: Alexander Marxer, Schaan (LI); Andreas Meyerhans, Nendeln (LI); Fredy Zuend, Widnau (CH)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 306 days.

(21) Appl. No.: 09/925,646

(22) Filed: Aug. 10, 2001

(65) Prior Publication Data

US 2002/0026984 A1 Mar. 7, 2002

Related U.S. Application Data

(62) Division of application No. 09/177,894, filed on Oct. 23, 1998, which is a continuation-in-part of application No. 08/903,000, filed on Jul. 30, 1997, now abandoned, which is a continuation of application No. 08/237,432, filed on May 3, 1994, now Pat. No. 5,693,238.

(30) Foreign Application Priority Data

May 3, 1993 (CH) .............................................. 1344/93

(51) Int. Cl.[7] ................................................ B01J 15/00
(52) U.S. Cl. .................... 216/4; 216/67; 156/345.32; 156/345.55
(58) Field of Search ................................ 414/150, 173, 414/221, 266; 901/50; 156/345.32, 345.55; 216/67, 4; 427/445

(56) References Cited

U.S. PATENT DOCUMENTS

| | | | |
|---|---|---|---|
| 4,798,739 A | 1/1989 | Schmitt | 427/38 |
| 4,987,004 A | 1/1991 | Yamazaki et al. | 427/38 |
| 4,989,543 A | 2/1991 | Schmitt | 118/723 |
| 5,112,641 A | 5/1992 | Harada et al. | 427/8 |
| 5,217,340 A | 6/1993 | Harada et al. | 414/172 |
| 5,515,986 A | 5/1996 | Turlot et al. | 216/71 |
| 5,751,003 A | 5/1998 | Rose et al. | 250/492.21 |
| 5,932,014 A * | 8/1999 | Hayashi et al. | 118/719 |
| 5,989,346 A * | 11/1999 | Hiroki | 118/719 |
| 6,053,980 A * | 4/2000 | Suda et al. | 118/719 |
| 6,066,210 A * | 5/2000 | Yonemitsu et al. | 118/719 |

FOREIGN PATENT DOCUMENTS

| | | |
|---|---|---|
| DE | 91 13 860 | 3/1992 |
| EP | 0 381 338 | 8/1990 |
| EP | 0 824 266 A | 2/1998 |
| JP | 60-68619 | 4/1985 |
| JP | 63-86423 | 4/1988 |
| JP | 2186628 | 7/1990 |
| WO | WO 97 26117 A | 5/1997 |

OTHER PUBLICATIONS

Hosokawa N: "Large Area Deposition: Sputtering– and PCVD–Systems and Techniques for LEC" Thin Solid Films, CH, Elsevier–Sequoia S.A. Lausanne, vol. 281/282, No. 1/02, p. 136–142.

* cited by examiner

Primary Examiner—Allan Olsen
(74) Attorney, Agent, or Firm—Crowell & Moring LLP

(57) ABSTRACT

An apparatus for plasma treating workpieces in vacuum comprises a stack of plasma chambers (20). Handling of workpieces to and from the plasma chambers of the stack is performed in parallelism by one handling device and through lateral handling openings of the plasma chambers. The handling device is rotatable around an axis parallel to the handling openings of the plasma chambers and comprises transport means simultaneously movable radially with respect to the axis of rotation towards and from the handling openings.

27 Claims, 21 Drawing Sheets

A: INTERNAL EXCHANGE
$B_1$: VENT  $B_2$: PUMP
C: EXCHANGE WITH AMBIENT
$D_1$ TO $D_3$: PROCESS 1 TO 3
LL: LOADLOCK
PM 1 TO 3: TREATMENT STATION 1 TO 3

PLASMA TREATMENT APPARATUS AND METHOD FOR OPERATING SAME

This application is a division of application Ser. No. 09/177,894, filed Oct. 23, 1998 which in turn is a Continuation-In-part of application Ser. No. 08/903,000, filed Jul. 30, 1997, now abandoned, which is a continuation of Ser. No. 08/237,432, filed May 3, 1994 now U.S. Pat. No. 5,693,238, issued Dec. 3, 1997.

FIELD OF THE INVENTION

The present invention is directed to a plasma treatment apparatus for parallel workpiece treatment. Attention is drawn to the following prior art: DE-U-91 13 860, EP-A-0 381 338 (corresponding to JP-A-2 297 925, U.S. Pat. Nos. 5,112,641 and 5,217,340) and DATABASE WPI, Derwent Publications Ltd., London, GB; AN 90-265161 C35, & JP-A-2 186 628.

SUMMARY OF THE INVENTION

It is an object of the present invention to provide a plasma treatment apparatus by which a predetermined number of workpieces may be parallel processed, whereby the number of operating cycles for such treatment is minimalized so as to reach optimal short throughput times with optimal low handling effort. Thereby, minimalizing handling effort results in an accordingly low constructional effort for the overall apparatus and in an accordingly low effort for controlling purposes of such an apparatus. As workpieces especially substrates shall be processed, i.e. workpieces which are at least substantially plate-shaped, plane or possibly bent.

Thus, the object of the present invention is to provide a plasma treatment apparatus with small footprint, enabling low manufacturing costs, especially for flat display panels as especially for flat active display panels, thereby especially for so called TFT display panels, which further allows high flexibility with respect to selection of different processing steps, allows use of a simple robot to load/unload the apparatus in ambient, and which further—and especially—allows high throughput.

This object is realised by an apparatus for vacuum plasma treatment comprising at least one treatment station with at least two substrate carriers stacked one above the other and in vertical alignment, further with at least two sealably closable handling openings vertically in mutual alignment and in horizontal alignment with said at least two carriers; a transport chamber communicating with said at least one station via said handling openings and comprising a transport robot being rotatable around a vertical axis and comprising at least two substrate supports extending horizontally and substantially aligned with said at least two carriers and being radially movable.

Thereby, the principle of parallel processing is strictly followed, not only for the mere substrate treatment, but also for substrate handling, i.e. for loading and unloading of the parallel arranged substrate carriers. This is realized, as mentioned, by the fact that the rotatable transport robot may simultaneously serve the carriers. With respect to the layout of plasma treatment facilities as may be implemented in the treatment station, we refer to the EP-A-0 221 812 and the EP-A-0 312 447 which are incorporated to the present description by reference.

Further, the concept of handling these substrates in a substantially horizontal position leads to a significant reduction with respect to constructional efforts and compared with handling in vertical position. This is true also with respect to hybrid forms in which workpiece handling switches from horizontal to vertical or vice-versa.

In one preferred embodiment of the inventive apparatus, the treatment station comprises at least two vacuum-tight separate treatment chambers with respectively one of said substrate carriers and one of said handling openings, especially for the application of deposition processes like PECVD.

In another, even more preferred embodiment the treatment station comprises at least two treatment compartments within a common vacuum chamber, whereby the treatment compartments within the common vacuum chamber communicate with the vacuum chamber by open gas flow communication or via pressure stages, which allow to maintain different pressures in the compartment and the vacuum chamber, especially for the application of etching processes like PE and RIE. Thus, in a most preferred embodiment the treatment station is formed by one common vacuum chamber with said at least two carriers therein. Further, in a preferred mode of the inventive apparatus, the treatment station comprises the same number of substrate carriers as the number of supports provided at the robot or an integer multiple of such support number and, as will be explained later on, transport and loadlock operation is based on parallel processing of a number of substrates equal to the number of supports at the robot. By parallel processing that number and especially just two substrates, thereby especially processing same in one common vacuum chamber, nevertheless with preferably two treatment compartments adjacent to each of the substrate carriers, there is provided a most compact, low footprint plant, also due to the fact that parallel processing occurs in vertical alignment. The preferred "just-two" concept gives optimum compromise of plant simplicity, high feed-through and simple handling from ambient.

BRIEF DESCRIPTION OF THE DRAWINGS

The present invention will be better understood and objects other than those set forth above will become apparent when consideration is given to the following detailed description thereof.

Such description makes reference to the annexed drawings, wherein:

FIGS. 2b to 2d show, departing from the apparatus according to FIG. 2a, the charge and discharge cycles of plasma chambers of an inventive apparatus principally according to said FIG. 2a;

FIG. 11 the most preferred apparatus according to FIG. 10 in schematic top view;

DESCRIPTION OF THE PREFERRED EMBODIMENTS

In the present description, by the expression "plasma chamber", there is understood an evacuatable space area wherein an independent plasma discharge may be sustained continuously or at least sometimes pulsed, be it a DC, an AC or, mixed, an AC+DC plasma discharge, thereby especially an RF plasma discharge. With respect to such chambers attention is directed to the EP-A-0 221 812 and the EP-A-0 312 447 which are both integrated by reference to the present description. Such a plasma chamber is in a preferred manner at least in part limited by walls. Typically in such a plasma chamber a pressure of $10^{-2}$ mbar to 10 mbar is sustained, preferably of $10^{-1}$ mbar to 1 mbar.

Figure 1:
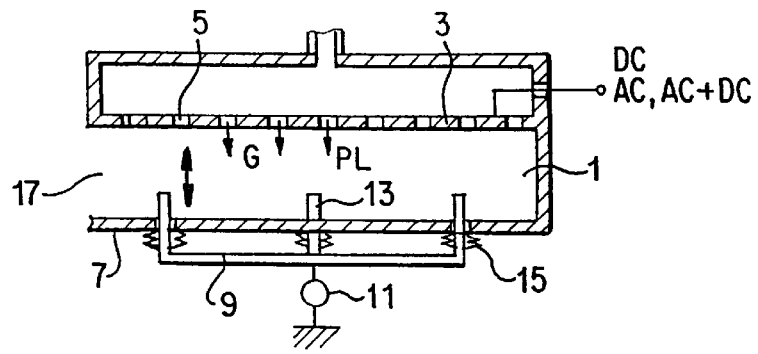
FIG. 1 shows schematically in a cross-section a first embodiment of a plasma chamber as it is used in the inventive apparatus as a preferred embodiment.

In FIG. 1, as an example and as a preferred variant, there is schematically shown a plasma chamber 1. It comprises on its upper side an areally extended electrode 3 which is fed by DC, AC or AC+DC electric energy, whereby the general expression AC shall, as was mentioned, especially enclose RF signals. Under the general term AC+DC mixed feed pulsed DC and/or pulsed RF signals are also understood. Under RP a frequency band between 1 and 100 MHz shall be understood.

At the embodiment shown in FIG. 1, the areally flat electrode 3 comprises areally distributed outlet openings 5, by which a gas, which at least comprises a reactive gas part, is fed to the plasma discharge space PL. At the bottom 7 of the plasma chamber 1 there is provided, in this preferred embodiment, a lifting mechanism 9 with a drive arrangement 11 for rising workpiece substrates. The lifting mechanism comprises e.g. three or four lifting rods 13 which are simultaneously moved by the drive 11 and which are e.g. sealed towards ambient of the plasma chamber 1 by means of bellows 15. It is also possible to construct the rods 13 so that they seal themselves the respective openings at the bottom 7 when they are lowered.

Such a plasma chamber forms the basic device for the inventive apparatus which will subsequently be described, which apparatus is in a clearly preferred manner an apparatus for performing PECVD coating of workpieces, but which could be also an apparatus for other vacuum treatment processes. Thereby, the inventive apparatus is preferably an RF PECVD layer deposition apparatus.

In FIG. 2 there is schematically shown a nearly minimal configuration of an inventive apparatus. Such apparatus comprises, as was said in its nearly minimal configuration, a staple 20 of e.g. twenty plasma chambers 1 which are stapled one above the other. The plasma chambers 1 are merely shown in the FIGS. 2a to 2d schematically, but are, in a preferred manner, constructed from chambers, one of which was shown and explained with the help of FIG. 1.

The plasma chambers 1 comprise each a lateral handling opening 17, which openings thus form together a handling opening staple. All handling openings communicate into a common vacuum space 23. This vacuum space 23 into which the said handling openings abut from the interior of the plasma chambers forms a transport chamber $23_T$. In this transport chamber $23_T$ there is provided a transport arrangement 25 which comprises a number of horizontal supports 27 which are, in a preferred construction, formed as support forks. The number of horizontal supports 27 foreseen is equal to the number of plasma chambers 1 which define the staple 20. The supports 27 are, as schematically shown by the arrow H, preferably synchronously, movable in horizontal direction, e.g., and as shown, in that they all are mounted to a carrier beam 29 which is drivingly moved forth and back. By this horizontal movement workpieces, namely in a preferred mode flat areal workpieces 31, are fed through the handling openings 17 to the plasma chambers 1 or are recovered from said plasma chambers 1 to the transport chamber $23_T$ as is shown from FIGS. 2b to 2d.

Figure 2A:
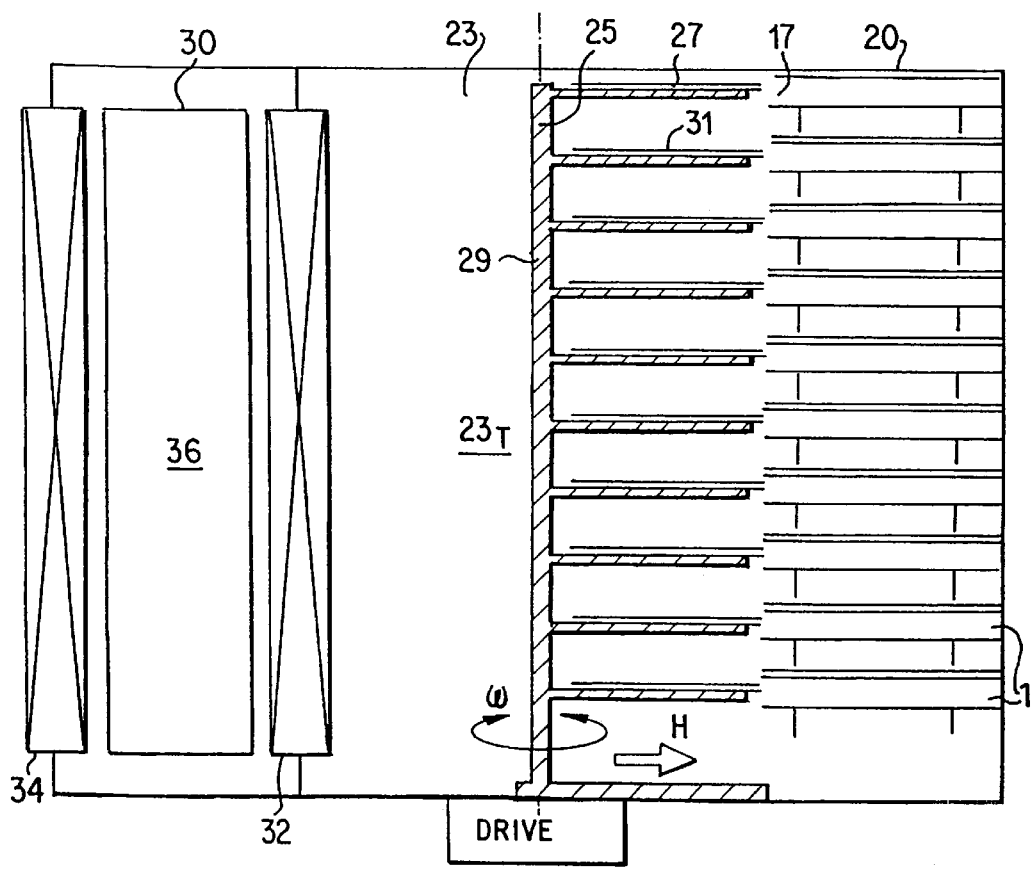
FIG. 2a schematically shows an inventive apparatus in a first configuration.
Figure 2B:
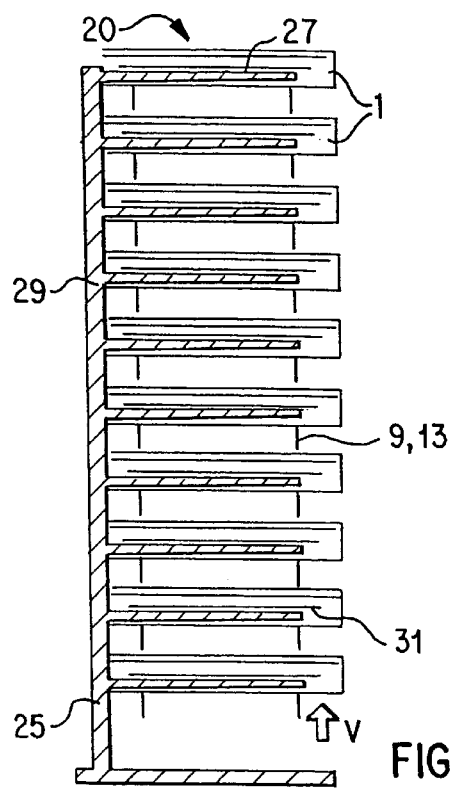

For loading all the plasma chambers 1 of the staple 20, the transport arrangement 25, according to FIG. 2a, is moved to the right hand side up to reaching the position according to FIG. 2b. Then, the lifting mechanism 9, which was shown at the plasma chamber 1 of FIG. 1, with the rods 13, is lifted, so that in all plasma chambers 1 the workpieces 31 are simultaneously lifted from the supports 27. This is shown in FIG. 2b schematically by the arrow V.

Figure 2C:
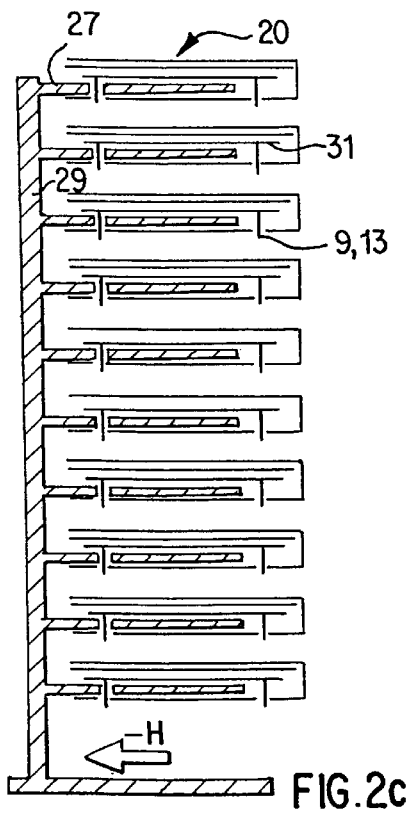
Figure 2D:
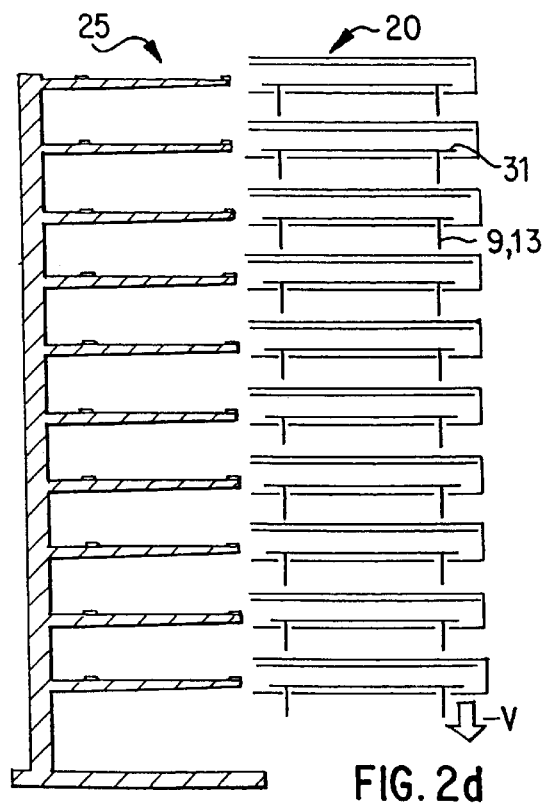

After lifting the workpieces 31 with the help of the lifting mechanism 9 with its lifting rods 13, according to FIG. 1, and reaching relative positioning according to FIG. 2c, the transport arrangement 25 with the supports 27 is horizontally moved back as shown in FIG. 2c by the arrow –H and the workpieces 31 are lowered into their treating position by lowering the lifting mechanism 9 according to FIG. 1.

It is evident that the described vertical relative movement of workpieces 31 with respect to the supports 27 could also be realized by synchronously lowering the supports 27 within the chambers 1 or, for recovering the workpieces, by synchronously lifting said supports 27, thereby depositing the workpieces in the chambers 1 for their treatment onto stationary supports.

In the nearly minimal configuration of the treatment apparatus which comprises, as was mentioned, a vacuum area with the plasma chamber staple 20 and further a transport area or space $23_T$, wherein the transport arrangement 25 is arranged and moved, further comprises, according to FIG. 2a, a load-lock chamber 30. As schematically shown, the load-lock chamber 30 is locked towards the transport area $23_T$ by a first load-lock gate 32 and towards ambient by a further load-lock gate 34. Within the load-lock chamber there is provided a magazine arrangement 36 for buffering workpieces still to be treated and/or which have already been treated.

To be able not only to serve the staple 20 of plasma chambers 1, but also the magazine arrangement 36 within the load-lock chamber, the transport arrangement 25 is not only shiftable in the horizontal direction H or –H, but is additionally drivingly rotatable around a vertical axis as shown at ω. Thereby, the supports 27 are rotated into serving positions for the load-lock chamber 30 and the magazine arrangement therein and into serving position for the handling openings of the plasma chambers 1.

As was mentioned above, the plasma chambers 1 of the staple 20 are preferably constructed so as to perform PECVD treatments Depending on the treatment process to be performed therein, the handling openings 17 of the plasma chambers 1 remain open towards the transport area $23_T$ during workpiece processing within the chambers 1, or there is just installed a pressure stage between the inside of the plasma chambers 1 and the transport area $23_T$, across which a pressure difference between inside of the plasma chambers and the transport area $23_T$ may be installed or the plasma chambers 1 are closed in a vacuum tight manner during the said workpiece treatment. For PECVD the openings 17 are closed.

Figure 3A:
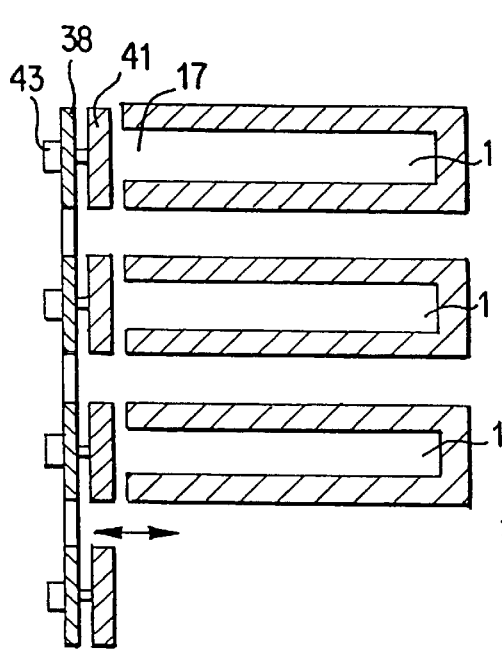
FIG. 3 shows schematically, and at plasma chambers provided at the apparatus according to FIG. 2a, door means to at least controllably realize a pressure stage between the inside of the plasma chambers and the transport chamber wherein their lateral handling openings abut or to even reach vacuum seal.
Figure 3B:
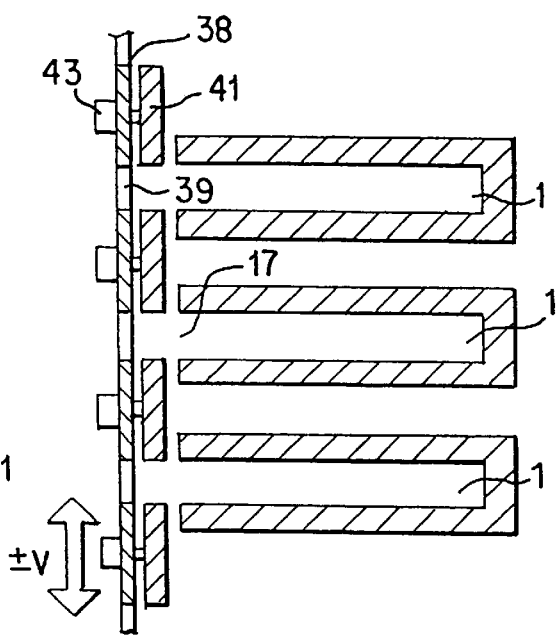

In FIG. 3 there are schematically shown two preferred modes of realization for shutting the handling openings 17 during workpiece treatment in a vacuum tight manner or just for installing a pressure stage with respect to said transport area $23_T$. A movable slide 38, movable in vertical direction as shown by the double arrow ±V, is provided which, rastered, according to the handling openings 17 along the staple 20, is provided with handling feed-through openings 39. The handling feed-through openings 39 are positioned by respective moving of the slide 38, according to FIG. 3b, to be aligned with the handling openings 17 of the plasma chambers 1, when handling of workpieces through the handling openings 17 is to be performed. In this position, the supports 27 may serve the plasma chambers through the feed-through handling openings 39. The slide 38 further comprises horizontally driven, movable shut-off plates 41 which are e.g. driven by capsulated driving rods and drives 43.

For shutting-off the treating areas within the chambers 1, the slide 38 is vertically moved into the position as shown in FIG. 3a. Then, the shut-off plates 41 are driven, according to that figure, to the right hand side, so as to shut off the handling openings 17 of the plasma chambers 1 in a vacuum tight manner or so as to just install between the transport area $23_T$ and the said treatment areas within said chambers 1 a pressure stage, whereacross pressure difference may be installed.

Departing from the nearly minimal configuration of the inventive apparatus according to FIG. 2, FIG. 4 schematically shows in top view an enlarged apparatus which now comprises two plasma chamber staples 20a and 20b as well as a transport area $23_T$ and a load-lock chamber 30. With the help of the sequence of figures from 4a to 4e, a preferred operation of such an inventive apparatus, especially for a PECVD treatment process, shall be described.

Figure 4A:
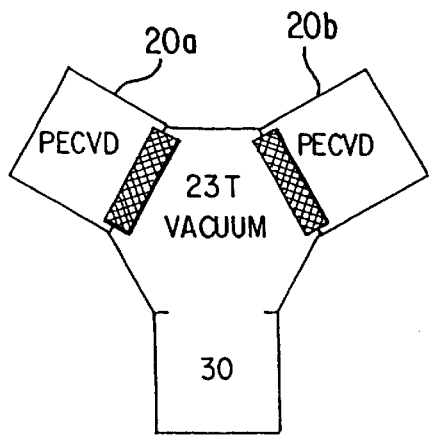
FIGS. 4a to 4e shows schematically in top view an inventive apparatus with two plasma chamber treatment stations and one load-lock chamber and a preferred operating cycle.

In the operating phase, according to FIG. 4a, the workpieces are PECVD-treated in both the plasma chamber staples 20a and 20b. To do this, there is at least installed a pressure difference across a pressure stage after shut-off of the handling openings 17 of the plasma chambers 1. The load-lock gate 32, according to FIG. 2a, is opened, whereas the load-lock gate 34 towards ambient is closed.

Figure 4B:
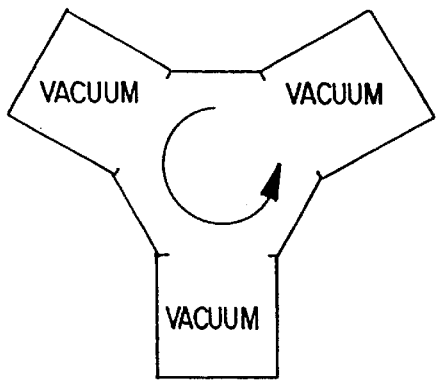

After termination of the treatment process, and as shown in FIG. 4b, the staples 20a and 20b are unloaded by means of the transport arrangement 25, according to FIG. 2a. Thereby, in a preferred mode, the two staples 20a and 20b are unloaded sequentially and the treated workpieces are deposited within the magazine arrangement 36 in the load-lock chamber 30. As will be described later, the magazine arrangement 36 comprises magazine slots, the number of which preferably according with at least the number of workpieces which may be simultaneously treated in the overall apparatus. In other words, with two plasma chamber staples, according to FIG. 4, there are preferably provided at least as many magazine slots as plasma chambers at the two staples.

Figure 4C:
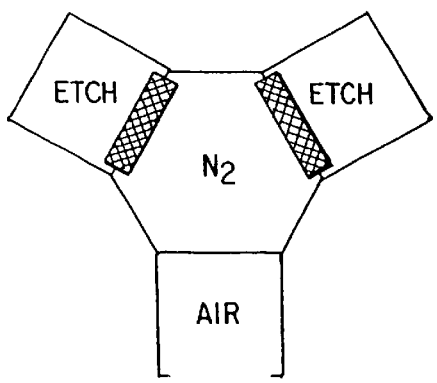

According to FIG. 4c, the load-lock gate towards the transport area $23_T$ is then shut and the load-lock gate 34 opened. The treated workpieces deposited within the magazine arrangement 36 are now replaced by workpieces still to be treated. During this unloading cycle of the magazine arrangement 36, the plasma chambers 1 of the staples are etched-cleaned, preferably by means of an RF plasma. To thereby prevent that cleaning gas and reaction products consisting of cleaning gas and etched-off material, etched-off from the plasma chambers being etched-cleaned, penetrate into the transport area $23_T$, in a preferred arrangement, as was described with the help of FIG. 3, there is installed a pressure difference between plasma chambers 1 and the transport area $23_T$, pointing towards the inside of the plasma chambers 1.

To do this, there is introduced a neutral gas into the transport area $23_T$ as e.g. nitrogen, in such a manner that there results a pressure gradient dropping from the transport area $23_T$ towards and into the plasma chambers 1. There is thereby prevented that cleaning dust penetrates into the transport area $23_T$. The chambers 1 themselves are pumped during cleaning etching.

During this time-span, the magazine arrangement 36 has been loaded with workpieces to be treated. These are then, in the next following step according to FIG. 4d, distributed to the now cleaned plasma chambers of the staples.

Due to the cleaning etching step, the walls and the electrode surfaces of the plasma chambers 1 have been heated.

Figure 4D:
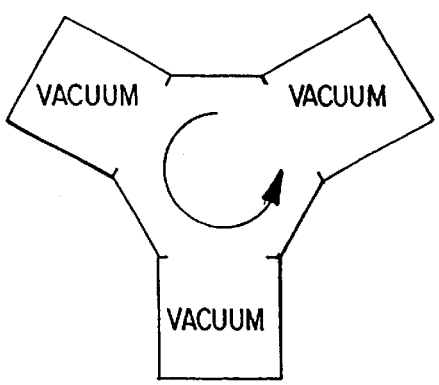
Figure 4E:
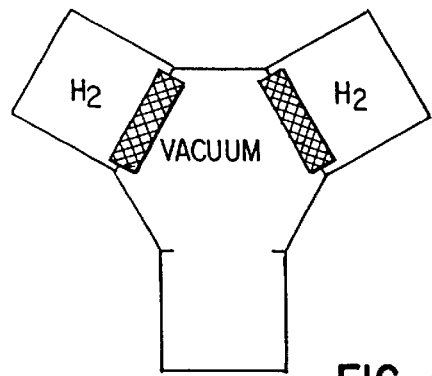

This heat is now, in a preferred mode according to step 4e, used for preheating the workpieces which are now loaded into the plasma chambers 1. Because distribution of the workpieces, in cycle according to FIG. 4d, is performed in vacuum, the heat conduction from the said parts, which have been heated by cleaning etching, is relatively low. Thus, after the workpieces to be treated have been loaded in the plasma chambers 1 and the latter are separated according to the description of FIG. 3 at least by a pressure stage from the transport area $23_T$, there is introduced a heat conducting gas, as e.g. hydrogen or helium, into the plasma chambers 1 with such a pressure that a significant heat conductance is initiated between the said heated parts of the plasma chambers 1 and the workpieces residing within the said chambers 1.

By means of such preheating of the workpieces, the workpieces, which were before stocked in normal atmosphere, are de-gased. After this preheating they are now, according to FIG. 4a, treated in the plasma chambers 1, so, in a preferred mode, PECVD coated.

In the apparatus as shown, all the plasma chambers 1 are separately pumped in a preferred embodiment. This especially during cleaning etching and during heating de-gasing of the workpieces.

Figure 5A:
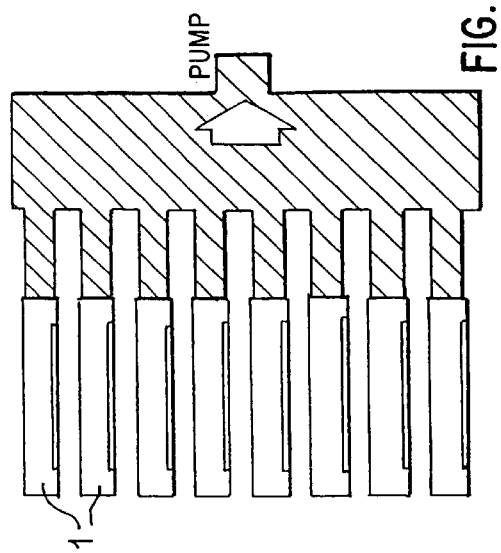
FIGS. 5a to 5d show schematically with respect to a plasma chamber station as provided at the inventive apparatus, according to FIG. 2, respectively, its centralized feeding with gas (a), its centralized pumping (b), its centralized feeding with electrical energy (c), as well as a centralized treating of measuring-, control- and/or negative feedback control loop- adjusting-signals, shown by the examples of centrally monitoring the plasma processes in the different plasma chambers by means of a central plasma emission monitor.

As schematically shown in FIG. 5, for reactive treatment processes to be performed, and especially for the preferred PECVD processes, according to FIG. 5a, all the plasma chambers 1 of at least one staple are fed from a central reactive gas feed. Thereby, it is ensured that all the chambers 1 are equally loaded with reactive gas. This is realized e.g. by feeding the gas departing from a buffer chamber 50 of relatively large volume to the chambers 1 via equal gas flow ducts 51, i.e. providing for equal flow resistances.

Figure 5B:
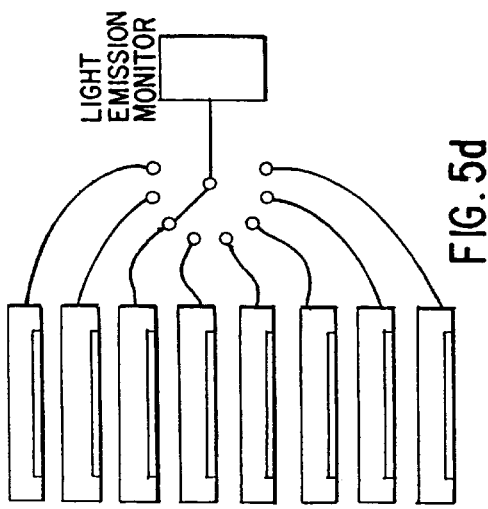

According to FIG. 5b, the chambers 1 are further, in a preferred mode, pumped from a central pump arrangement as all the chambers 1 of at least one staple should be synchronously pumped.

Figure 5C:
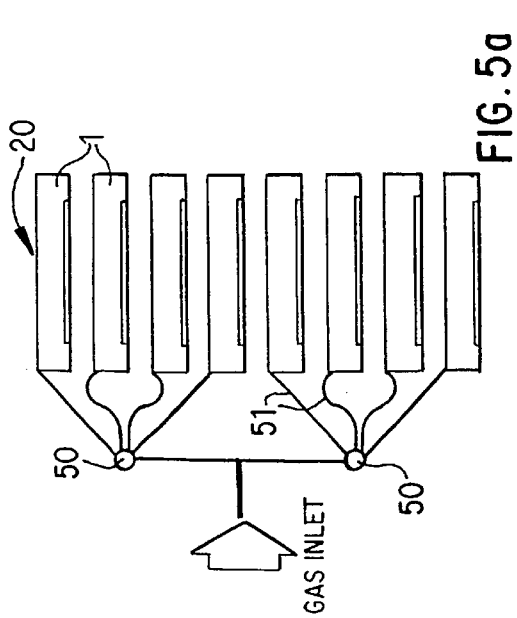

The supply with electrical energy to the chambers 1 of at least one staple is preferably realized in a most economic way from a central generator unit. In the preferred case of treating the workpieces in an RF plasma, according to FIG. 5c, all the chambers 1 of at least one staple are fed from a central RF generator with a centralized matching network and, if necessary, with additional matching networks for chamber specific adjustment. This is shown in FIG. 5c by the respective inductions assigned to the respective chambers, wherewith different RF power conditions may be adjusted for every chamber 1.

If the processes performed within the plasma chambers 1 shall be monitored, open-loop controlled or negative feed-back controlled, this, too, is preferably performed via a central unit. This central unit is linked to the different chambers 1, according to the occurring need, be it in the sense of multiplexing with a predetermined sequence of connection to the chambers, be it with a varying sequence, controlled by the need at the different chambers 1.

Figure 5D:
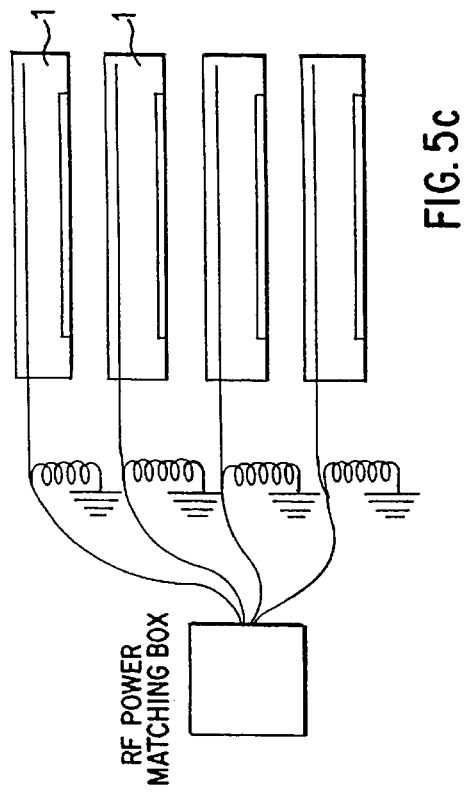

This is schematically shown in FIG. 5d by means of an example, which shows monitoring the processes in the chambers 1 by means of a central plasma emission monitor which is sequentially connected to the different chambers.

Figure 6:
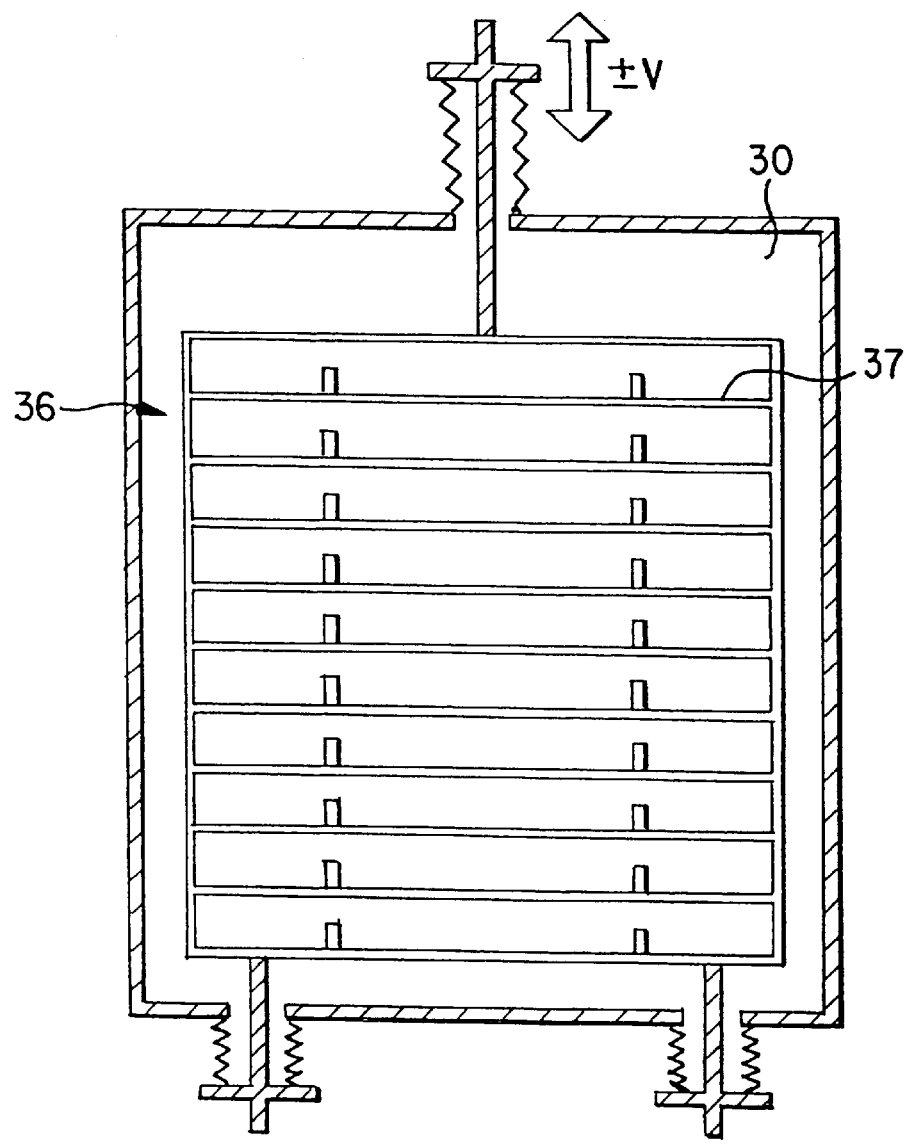
FIG. 6 shows schematically and in cross-section a preferred embodiment of a load-lock chamber magazine arrangement at the apparatus according to FIG. 2.

In FIG. 6 there is schematically shown a preferred construction of a magazine arrangement 36 in a magazine or load-lock chamber 30 according to FIG. 2a. The magazine arrangement 36 comprises a number of magazine slots 37, the number of which being preferably at least equal to the number of workpieces which may synchronously be treated in the apparatus. The number of magazine slots is thereby preferably the double of the number of workpieces which may be synchronously treated, i.e. the number of plasma chambers at the inventive apparatus. Thereby, feed-through of workpieces through the load-lock chamber is significantly simplified. In the case where, according to FIG. 2a, there is installed a relative vertical movement between resting surfaces for the workpieces in the chambers 1 and the supports 27 by lifting mechanism 9 in the plasma chambers 1, as explained with the help of FIG. 1, and thus the supports 27 do not perform vertical loading and unloading movements, then, and according to FIG. 6, the magazine arrangement 36 is preferably vertically movable as shown with the double arrow ±V. Thereby, the workpieces may be lifted off or deposited from or on the supports 27.

Up to this point, there was described a novel apparatus concept as well as its preferred operation, especially for RF-PECVD coating processes.

In the following, there will be described a novel method which also and especially may be realized at the said described inventive apparatus. This method and accordingly apparative features to perform it results in a significant improvement of coating rate and coating quality at plasma coating processes. The method and the respective apparatus features to be described may be applied generally for plasma coating processes, be it DC, AC or AC+DC plasma processes, as they were defined before. The following description is nevertheless especially valid for reactive RF plasma enhanced coating processes as for RF-PECVD processes. They are, nevertheless, also valid e.g. for RF ion plating processes. Thereby, we understand, as was mentioned, under RF a frequency range between 1 and 100 MHz.

Nevertheless, when we refer in the following description to such RF plasma enhanced reactive processes, this shall not be understood as the described method restricted to such processes.

Figure 7A:
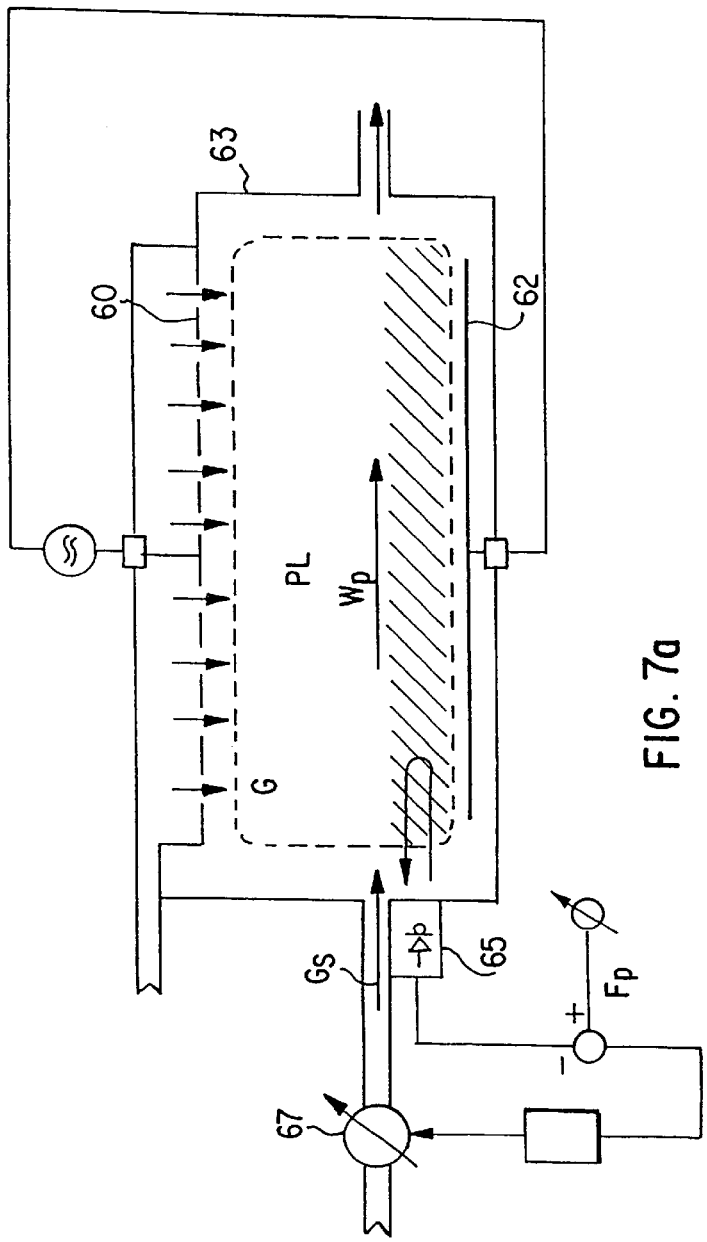
FIG. 7 shows schematically and in cross-section a preferred improvement of the chamber as shown in FIG. 1, which is inventively stapled in the treatment station of the inventive apparatus for explaining a preferred operation of such plasma chambers by controlled exploitation of dust in the plasma process atmosphere.
Figure 7B:
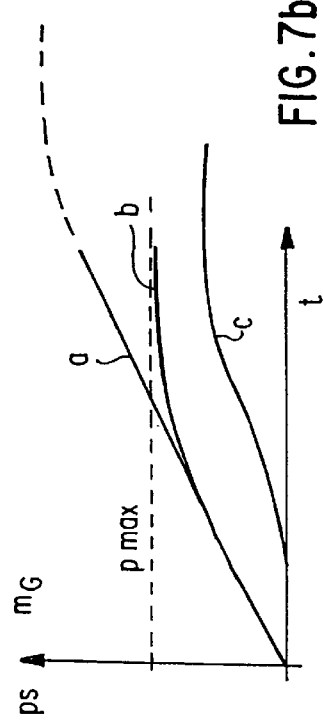

In FIG. 7 there is schematically shown a plasma chamber, e.g. of the kind as shown in the FIG. 1 or 2. An areally extended RF electrode 60 forms also an areally distributed gas injection arrangement, at least for a reactive gas G, which gas is injected into the plasma discharge space PL. Opposite to the RF electrode 60 there is provided a workpiece carrier electrode 62, as known in this specific art.

With respect to electrical DC potential conditions, it is obvious to the man skilled in the art that the encapsulation walls 63 of the plasma chamber and/or the workpiece carrier electrode 62 may be deposited, as is common, on an electric reference potential, as e.g. on ground potential. Nevertheless, the man skilled in the art effectively knows all possibilities of biasing the different parts of the chamber to electric DC potentials.

At a reactive plasma coating of workpieces, e.g. deposited on the workpiece carrier electrode 62, there is formed dust within the plasma discharge space. The density of this dust is depicted by $\rho_s$. Dust in the plasma discharge may originate from a multitude of sources, mainly from the coating process itself, but also from mechanical friction during loading and unloading the chamber with workpieces. Principally, the dust density $\rho_g$ rises during a reactive coating process. This is shown at the bottom part of FIG. 7, purely qualitatively, by a steadily rising characteristic (a) of dust density over time.

Without any counter-measures, the dust will start to precipitate out of the plasma discharge and will deposit on the surfaces within the reactor chamber exposed to the plasma discharge. Thereby, the growing up layer on the workpiece is contaminated with dust particles, which leads to layer defects.

Additionally, the behaviour of the overall reactor is changed, which leads to drifting off of the process. Today's production plants which realize dusty processes, therefore, do not lead to coatings with the required low degree of detect nor do they reach the required low ratio between cleaning and production times, named equipment availability.

Up to now, the attempts to resolve these problems were to generate as few as possible dust. Because this may not completely be prevented, still generated dust was removed from the coating area as completely as possible. Thereby, one did not care about a resulting decrease of coating quality, as will be shown.

It was now recognized by the inventors of the present invention that dust present in a plasma discharge, and thereby especially in an RF plasma discharge, significantly increases the coupling degree of electrical energy, and thereby especially of RF energy, to the plasma and that principally the coating rate, and especially the coating rate of a reactive coating process, is significantly increased in a dusty plasma, especially in a dusty RF plasma.

Thus, up to now, preventing the formation of dust and removing dust from the plasma discharge led to non-exploitation of maximum possible coating rate and process efficiency. The considerations with respect to improving the efficiency and coating rate of a plasma coating process by dust are only valid so long as the dust density does not rise above a threshold value in the plasma discharge. If the dust density rises above such limit value, dust particles may start to agglomerate to form larger dust particles, which will aggregate on the coating just being about to be grown or having been deposited. Such aggregation must normally be avoided, especially in connection with semi-conductor production and the production of flat active display screens.

Thus, the novel recognition bases on the fact that dust in a plasma discharge area, especially in an RF plasma discharge area, as especially for a reactive plasma enhanced coating process, should not be removed, but the dust density should be maintained below or at the most on a predetermined value $\rho_{max}$. Thus, the number of dust particles per unit volume and/or the largeness of such particles and therewith again the dust density and the distribution thereof are inventively controllably adjusted. This adjustment is realized taking into consideration the results of pre-experiments, whereat, for a specific treatment process considered, concise optimal dust density values and distributions in the plasma discharge space have been found. As an example, there is shown in FIG. 7 with the curve (b) a possible time course of power density which is controllably aimed at.

This dust density control is generally realized, according to FIG. 7, by generating a dust particle transversal stream $W_p$ in a controlled manner by generating a transversal force field, so that excess dust particles are carried out of the active coating area of the plasma discharge and are finally removed as the need occurs from the chamber.

According to FIG. 7, a preferred realization form of such a transversal force field is to realize a transversal gas stream. This, again, is realized by installing a transversal pressure gradient. As schematically shown, to do this, gas is laterally fed to the reactor chamber and gas is removed from that chamber opposite to its inlet. Additionally, or instead of realizing a transversal pressure gradient, it is possible to realize transversal particle current by installing electrostatical gradients and/or thermical gradients, so as to disable dust density to rise in the coating effective area of the plasma discharge space above a predetermined value.

At the bottom of FIG. 7, the characteristic (c) qualitatively shows, as an example, the time course of controlled gas quantity $m_G$ inlet.

In spite of the fact that it is absolutely possible to determine by pre-experiments when, during the coating process, a transversal force field should be installed and how large it should be, so as to control the dust density in the discharge space, it is, in a preferred mode of execution, absolutely possible to measure, e.g. by means of light reflection or absorption, as is schematically shown in FIG. 7 by the detector 65, the instantaneous dust density and possibly its distribution in the plasma. The instantaneous value is then compared with a rated value $F_p$ and the force field, which is, in FIG. 7, the pressure gradient, is then adjusted in a negative feedback controlled loop so that the dust density remains on a desired level. Because the plasma impedance is significantly influenced by the dust density, such a negative feedback control loop may also make use of a plasma impedance measurement to monitor the instantaneous duet density.

When a transversal gas stream is used to generate the described particle current, the adjustment of such transversal gas stream is preferably done by adjusting the amount of gas injected per time unit to the plasma discharge space, as is shown schematically in FIG. 7 by adjusting walls 67.

The force field which is used to remove excess dust particles from the coating area may also intermittently be applied. This would mean, in the case of FIG. 7, that a gas $G_s$, which will be generally named scavenger gas, which generates the transversal current W, is inlet in a timely pulsed manner.

As was already mentioned, this method has shown highly satisfying results, especially applied for reactive RF plasma coating processes. This, because such processes, and especially reactive processes, intrinsically produce powder or dust in the plasma discharge.

If, according to FIG. 7, a scavenger gas $G_s$ is used to realize the transversal current W, preferably a neutral plasma working gas, as e.g. argon or helium, is used as scavenger gas or a gas which is not effective for the coating deposition, as e.g. hydrogen. Using a gas which significantly contributes to the coating formation as a scavenger gas, may influence coating deposition distribution in an undesired manner.

It is essential to recognize that dust or powder remains trapped within the plasma discharge as long as the plasma discharge is maintained. Thus, when a plasma treatment process or, more generally, the plasma discharge shall be interrupted and one wants to prevent that the dust trapped in the discharge settles in the treatment chamber, then one of the following procedures is proposed:

instead of reactive gas, a neutral gas is inlet, so that, when the coating formation shall be stopped at a predetermined time, a further coating deposition is stopped. By maintaining the now neutral plasma ignited, the dust remains trapped in the plasma discharge and is swept out. Thereby, additional formation of dust in the plasma, which is now a neutral plasma, is significantly reduced.

In the maintained reactive gas plasma discharge or in the just mentioned neutral discharge, the transversal force field is increased. In the preferred mode of using a scavenger gas, the transversal stream of scavenger gas is increased by increasing the amount of gas inlet per time unit and/or increasing suctioning power at the gas removing port.

One may further continuously reduce the plasma discharge intensity, but thereby preventing extinction of the discharge. Thereby, the dust trapping effect of the plasma discharge is steadily reduced, which improves sweeping out of the dust particles by the said transversal force field.

By simultaneously reducing the discharge intensity and increasing the lateral pumping power and/or the amount of inlet scavenger gas per time unit, a maximum sweep-out of the duet particles from the coating area adjacent workpiece carrier electrode 62, according to FIG. 7, is reached.

Principally, the inventively applied transversal force field may be enhanced by operating the plasma discharge in a timely pulsed manner. Thereby, the average dust trapping effect of the plasma discharge is reduced and the controlled sweeping out of excess powder is simplified. This is not only valid for stopping the coating process, but also during coating.

It is essential that the plasma discharge is maintained up to the moment when the dust entrapped therein is at least substantially removed before the coating process is stopped.

This recognition leads to a further preferred mode of operation, according to which a plasma discharge is maintained in the plasma reactor chamber even then, when e.g. workpieces are loaded or disloaded to or from such reactor chamber.

A plasma discharge, which is, with respect to the reactive coating process, ineffective, so in a gas which is neutral with respect to the coating process, may be applied, with the target to etch-clean an uncoated or a coated workpiece or the plasma reactor chamber. E.g. a hydrogen plasma may be used for this target. It is thereby important that by such an etching plasma, also particles residing on the workpieces are trapped from the discharge and may be swept out as was described.

Thus, e.g. at the end of a treatment process, a hydrogen cleaning plasma may be installed, e.g. during discharge and re-loading of the plasma chamber with workpieces. Because for etching dust in the plasma discharge is only a disturbing factor, the transversal force field is thereby adjusted to its maximum effect.

By operating an RF plasma discharge for a reactive coating process by the method which was described based on FIG. 7, for generating α-Si-layers of defect-free quality and without dust deposition within the reactor, the coating rate, i.e. the amount of coating material deposited per time unit, was risen by a factor of about 2.5 and simultaneously the inherent layer stress was reduced by a factor of about 2.5. Due to the increased deposition rate, the purity of the resulting layer was improved by a factor of approx. 2. This compared with a coating process in the same plasma reactor chamber, during which, by means of well-known techniques, it was attempted to keep the dust density minimal by selecting a process working point at low pressures and at low power. When using the said known technique of dust density minimalizing, the coating rate for α-Si-layers is smaller or equal 4 A/sec with layer stress larger than $5 \times 10^9$ dyn/cm$^2$. In opposition thereto, the inventive technique of dust density control leads to deposition rates of more than 10 A/sec, so to rates of e.g. 33 A/sec at layer stress smaller than $2 \times 10^9$ dyn/cm$^2$.

As was already mentioned, the preferred mode for realizing the transversal force field is to install a transversal gas stream, as has been explained with the help of FIG. 7, across the plasma discharge.

In FIG. 8, five different variants a) to e) are shown to contribute to installing the said transversal force field, i.e. the said pressure gradient, by measures taken on the suction side, i.e. on the gas removing side of the reactor.

Figure 8A:
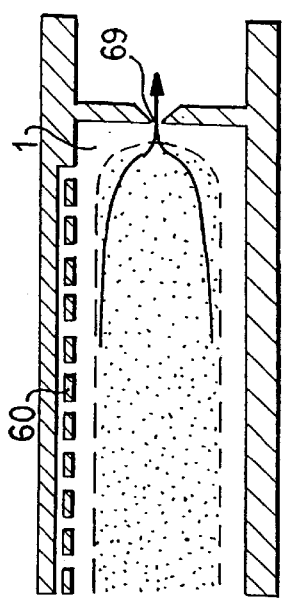
FIGS. 8a to 8e preferred embodiments of suction arrangements at plasma chambers of the inventive apparatus according to FIG. 2 for realizing dust exploitation as generally explained with the help of FIG. 7.

According to FIG. 8a, pumping of gas from the treatment space or the discharge space is realized through a narrow slit 69 in the wall of the plasma reactor chamber 1, which wall being electrically led on a defined potential, so e.g. on ground potential. The width of the slit is so that the plasma discharge may not expand across the slit 69 and preferably is in the range of between 2 to 4 mm. In a preferred manner, the transversal gas stream discussed with respect to FIG. 7 is significantly co-realized by gas inlet through the scavenger gas inlet shown in FIG. 7, which is also done at the embodiments according to FIGS. 8b to 8e.

Figure 8B:
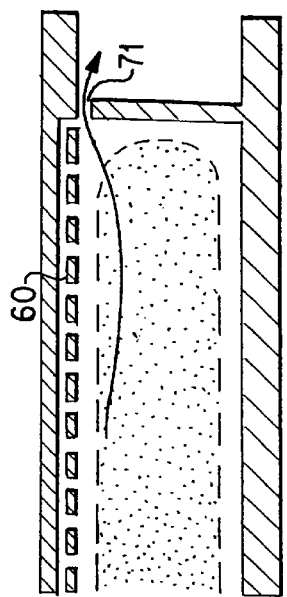

According to FIG. 8b, a suctioning or pumping slit 71 is provided adjacent to the edge of electrode 60. Thereby, a further principle is preferably followed. It was recognized that dust density is maximum there where the electric field feeding the plasma discharge is maximum. This is, as well-known, at edges and spikes of equipotential surfaces. This is the reason why, according to FIG. 8b, pumping is realized by means of slit 71 adjacent to the corner of electrode 60, i.e. in an area where an increased dust density prevails because of the increased electric field strength.

Figure 8C:
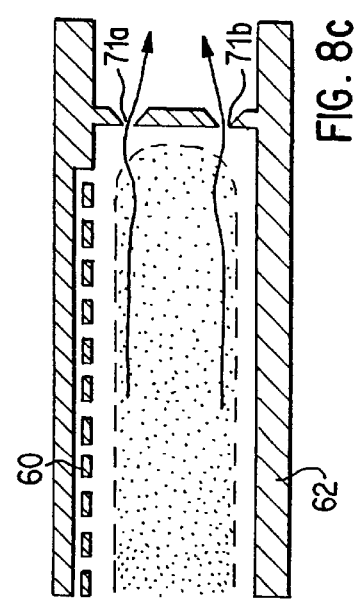

In the embodiment according to FIG. 8c this concept is followed up in that suctioning or pumping slits 71a and 71b are provided on both sides adjacent the edges of the two electrodes 60 and 62.

Figure 8D:
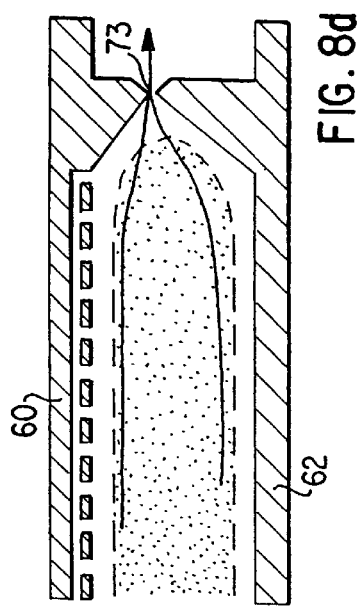

The velocity of transversal gas stream is increased by the embodiment according to FIG. 8d which shows a steadily converging suctioning slit 73. The increase of the said velocity becomes effective in a more expanded part of the plasma discharge area, so that efficiency of transversal scavenger gas flow with respect to dust density control is improved.

Figure 8E:
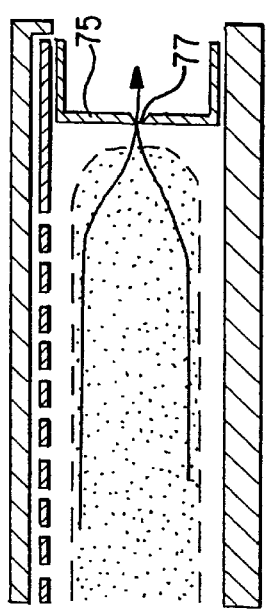

According to FIG. 8e, the wall part 75 of the plasma reactor chamber 1, wherein the suctioning slit 77 is provided, is operated electrically on floating potential. Thereby it is reached that the electrostatical potential barrier, which has to be overcome by the powder particles as they are extracted from the discharge, is lowered. This because the electric potential of the wall part 75, operated on floating potential, will assume an intermediate value between the potentials of the electrodes 60 and 62.

A further possibility which is quite obvious is to provide across the suctioning slit a grid. Thereby, the opening of the slit and thus the pump-effective cross-section of the pumping pipe may be enlarged, without that the plasma discharge penetrates through the slit.

It is further evident that the features of the gas removing arrangements, according to the embodiments of FIG. 8, may be combined.

Looking back to the novel apparatus configuration with plasma chamber staples, there is shown, in FIG. 9, how at such an apparatus, and considering the just described novel approach, charging and unloading the plasma chambers 1 is preferably carried out.

Figure 9A:
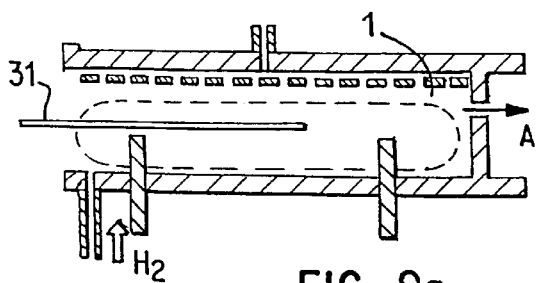
FIG. 9 shows schematically a preferred handling sequence of plasma chambers inventively stapled at the treatment station of the inventive apparatus, thereby exploiting the method which has been described with the help of FIG. 7, on one side for controlling dust formation in the plasma discharge, on the other hand for controllably exploiting such dust formation for increasing treatment quality and efficiency and thereby especially plasma coating rate.
Figure 9B:
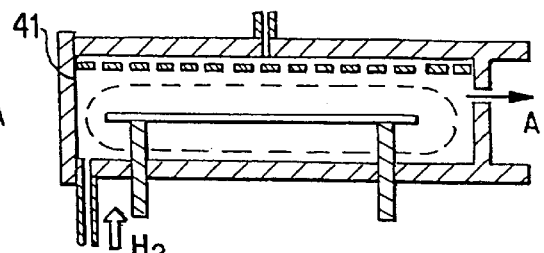

According to FIG. 9a, a workpiece 31 (see FIG. 2a) is deposited on the rods 13 of a lifting mechanism 9. According to FIG. 9b, as workpieces 31 have been introduced into the chambers 1 and a pressure difference may be installed between chamber 1 and transport area $23_T$, there is ignited a neutral plasma in the plasma chamber 1 after such a pressure difference has been installed between the inside of the plasma chamber 1 and the transport area $23_T$ according to FIG. 3, by means of the shutting-off plates 41. Such a plasma is maintained during the steps according to FIGS. 9b and 9c. A non-reactive gas, so e.g. argon and/or hydrogen, is inlet to the reactor chamber as shown. Thereby, and as was described, the workpiece 31 is also heated up, so e.g. for its degasing. Suctioning at A is active.

Figure 9C:
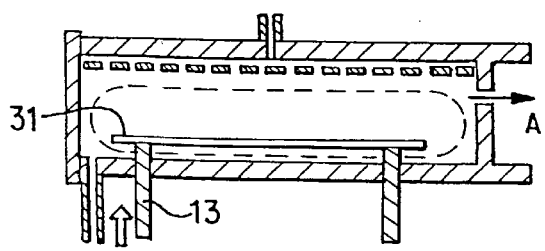
Figure 9D:
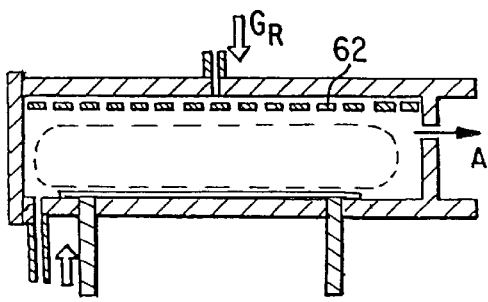

Dust which has e.g. formed during mechanical movement of the workpiece 31, according to FIG. 9c, is trapped in the neutral plasma and is removed by means of the neutral gas transversal stream at suctioning port A. As soon as, according to FIG. 9d, the workpiece 31 has been lowered in its treatment position, the reactive gas inlet is initiated in a preferred manner through the gas inlet shower formed by the RF electrode 62, as well as through the lateral scavenger gas inlet as shown. During the coating process following up the dust density in the plasma discharge is not minimized, but is, as was described with the help of FIG. 7, controllably adjusted so as not to grow above a predetermined level.

Figure 9E:
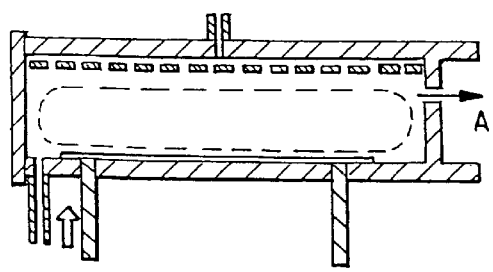
Figure 9F:
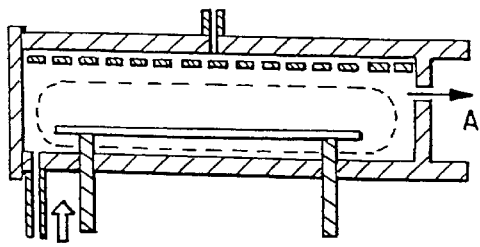

After termination of the coating process, and according to FIG. 9e, the transversal stream of reactive gas is increased or there is injected a neutral gas or there is switched onto a neutral plasma discharge (not shown), as was earlier described. It is important that also during lifting up of the coated workpieces, according to FIG. 9f, there is maintained a dust trapping plasma discharge, be it a neutral plasma discharge or the reactive plasma discharge, latter in the case where coating process needs not to be terminated at a well-defined moment.

Figure 9G:
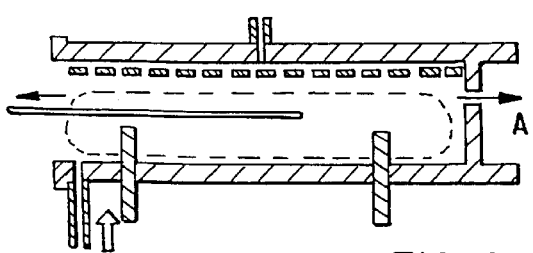

According to FIG. 9g, thereafter, the workpiece 31 is removed from the plasma chamber 1. In this operating phase, as well as possibly in that shown in FIG. 9a, but especially in that of FIG. 9b, it is preferred to also maintain a plasma discharge, not a reactive plasma discharge, but a neutral plasma discharge, especially a hydrogen plasma discharge. This, on one hand, for further trapping dust particles, and, on the other hand, for cleaning-etching the inside of plasma reactor chamber 1.

As is shown in the FIGS. 9a and 9g, there is introduced therefore hydrogen gas and, on the other hand, gas is removed by suctioning, so that dust trapped in the plasma is removed from the reactor chamber as completely as possible in the respective operating phases.

Additionally to the described gas suctioning ports, co-installing the transversal gas stream, additional auctioning openings may be provided, so e.g. along the electrode 60, and distributed as the reactive gas inlet openings therealong. By specific layout of the distribution of such gas inlet and outlet openings, the homogeneity of the coating along the workpiece surfaces, thus the resulting thickness uniformity of the film deposited, may possibly be optimized.

Figure 10:
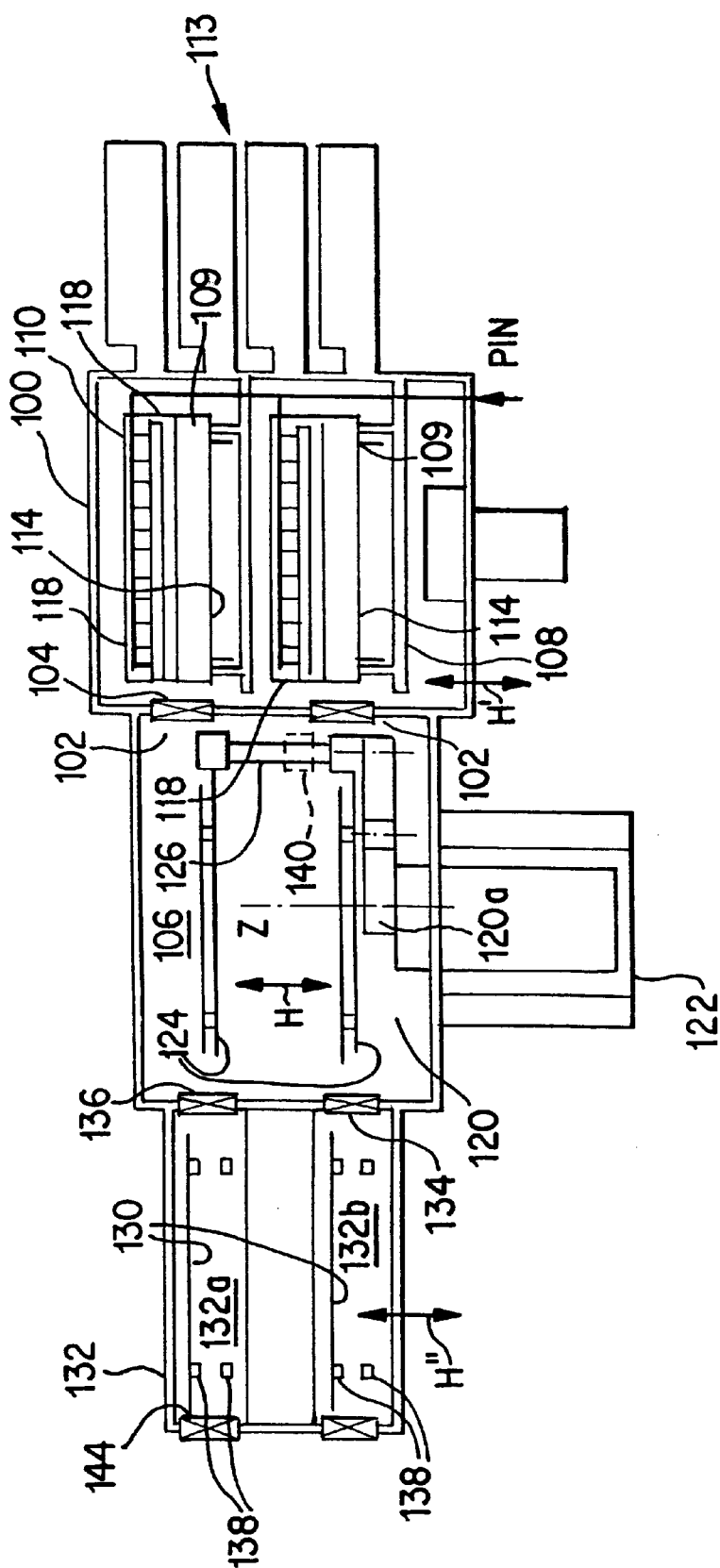
FIG. 10 a schematic side-representation of an inventive apparatus in a most preferred form of realisation.
Figure 11A:
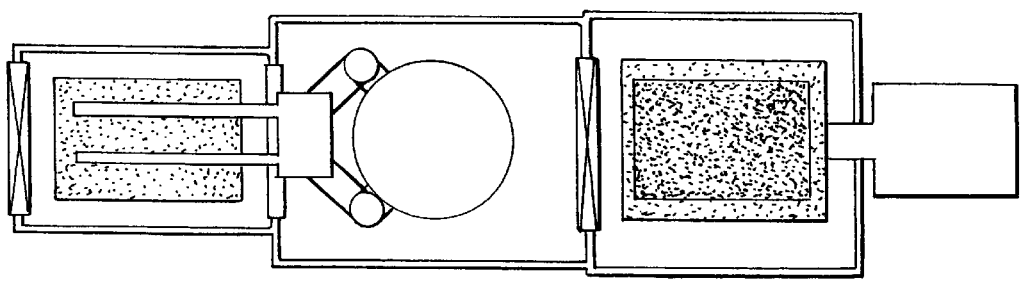
Figure 11B:
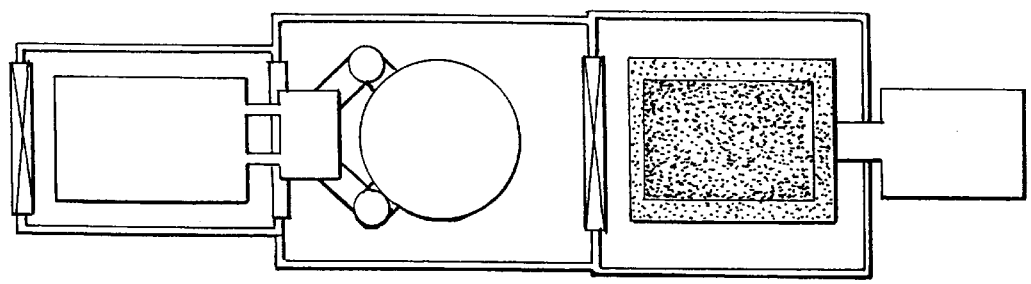
Figure 11C:
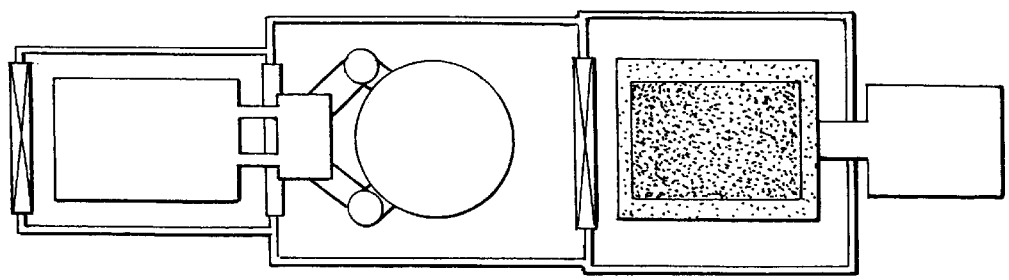
Figure 10C:
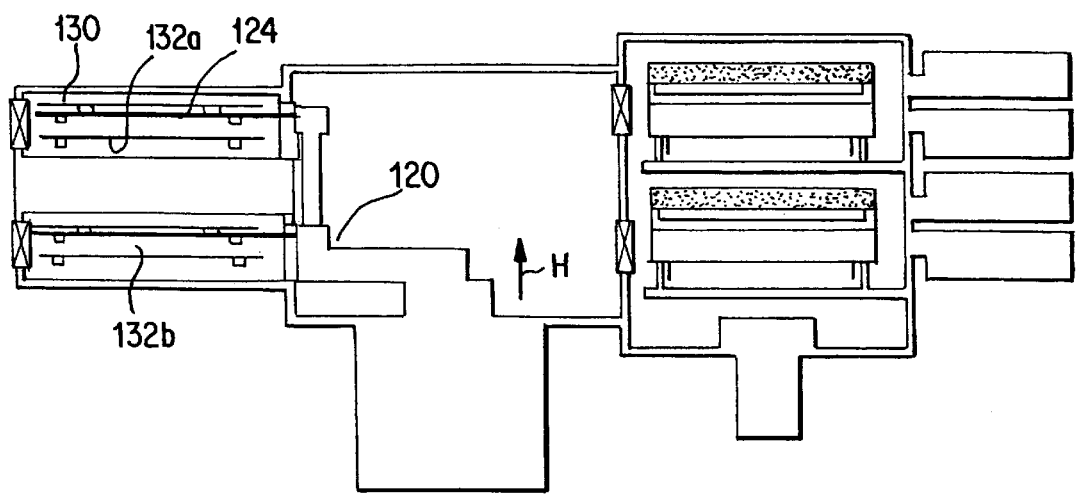
Figure 11C:
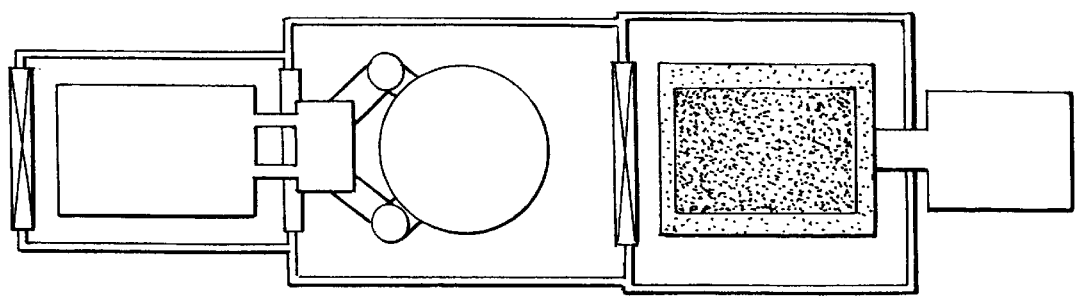
Figure 12:
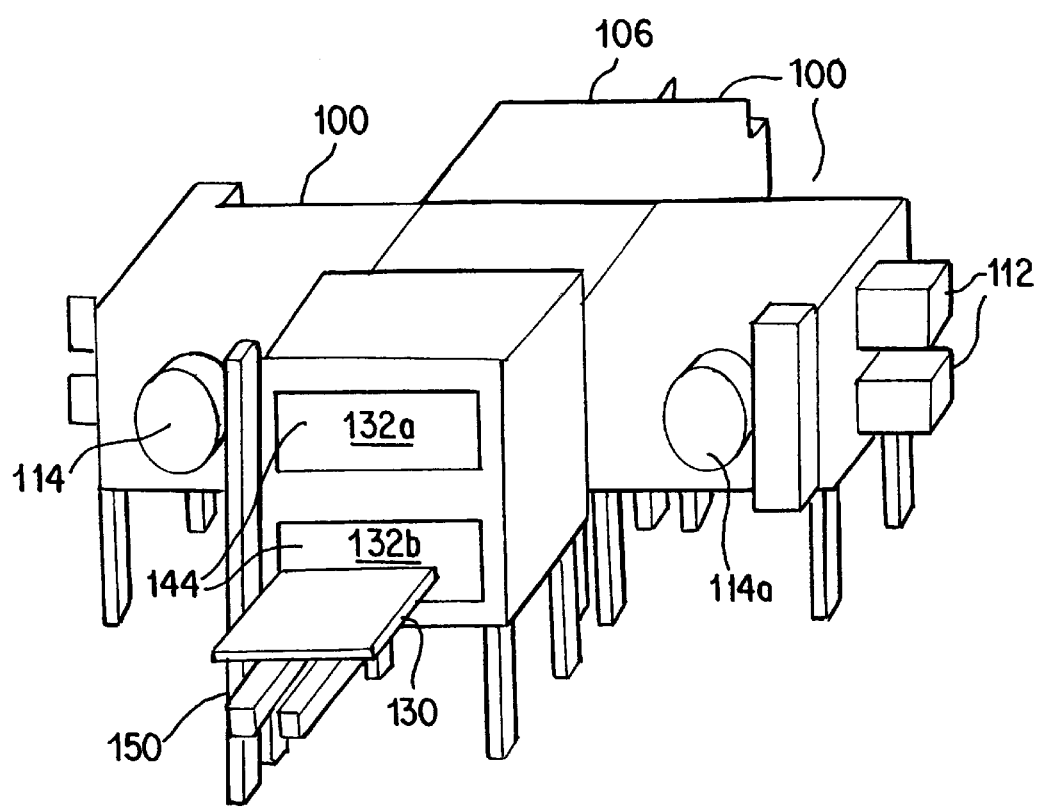
FIG. 12 a schematic representation of a most preferred configuration of the apparatus according to FIGS. 10 and 11.

In the FIGS. 10, 11 and 12 a most preferred embodiment of the inventive apparatus is shown. It comprises at least one treatment station 100 which communicates via handling openings 102, controlled by valves 104, preferably slit valves, with the central transport chamber 106. Within the treatment station 100 there are provided preferably two substrate carriers 108 stacked one above the other. Adjacent to and facing the substrate carriers 108, there is respectively provided, whenever required by the process, a two-dimensionally extended Rf plasma discharge electrode arrangement 110 being e.g. a sputtering target electrode arrangement or especially a counter-electrode arrangement for sputter etching substrates deposited on the respective substrate carriers 108. The two dimensionally extended, substantially flat electrode arrangements 110, if provided, are operationally connected to an Rf supply generator arrangement 112 which may comprise a supply generator arrangement for each treatment source, e.g. electrode arrangement 110, or and preferably comprises one Rf generator arrangement for the two treatment sources, as was explained with the help of FIG. 5c.

At least a part of generator arrangement 112 may be mounted to the treatment station 100 opposite from the handling openings 102. The openings 102 are mutually aligned vertically and are substantially aligned horizontally to the substrate carriers 108.

Although within the treatment station 100 two or more than two vacuum-tight separated treatment chambers as e.g. shown in FIG. 3 may be provided—especially for PECVD processes—, each respectively with one of the substrate carriers 108 and one of handling openings according to 17 of FIG. 2, in the FIGS. 10, 11 and 12 an even more preferred embodiment is shown —especially for PE or RIE. Thereby, and within a common vacuum chamber 100a with the handling openings 102 the at least two substrate carriers 108 are disposed within respective treatment compartments 109. The compartments 109 are either in complete open gas communication with vacuum chamber 108 or are, as shown in the figs. and even more preferred, separated from vacuum chamber 108 by pressure stages allowing to establish a pressure difference between the inside of the treatment compartments 109 and the surrounding atmosphere of vacuum chamber 108. As shown especially in the FIGS. 10 and 11, the respective compartments 109 are defined on one side by the substrate carriers 108, opposite thereto treatment sources as the electrode arrangements 110 or possibly even a passive wall and further laterally by walls as well or, in the preferred form, by gas removal grids 114, acting as pressure stages as well as by Rf screens 118, which may be provided all around the respective treatment compartments with the carriers and which have a movable—as pivotable—input port adjacent to the respective handling opening 102 for handling respectively substrates therethrough. For the preferred use as an etching system, pressure differences at pressure stages should be as small as possible, so that the chamber separation predominantly acts electrically.

If required, a noble gas and/or reactive gas inlet is provided to each of the separated treatment chambers or to each of the at least two treatment compartments 109 and/or, commonly for the treatment compartments, to the common vacuum chamber 108.

A pumping port (not shown) for removing consumed reactive gas is either arranged to each of the at least two per se vacuum-tight separated treatment chambers (not shown) or to each of the treatment compartments within the common vacuum chamber, but is in a preferred embodiment and as shown especially in FIG. 12 to be understood in connection with FIGS. 10 and 11 connected to the vacuum chamber 100a to remove gas from the treatment compartments 109 via grids 114. Such pumping port is shown in FIG. 12 at 114a.

Thereby, pumps, preferably turbo-vacuum pumps, are directly mounted to port 114a, whereby preferably via a valve arrangement, preferably a butterfly-valve, which can be used as pressure and/or flow regulating valve.

By provision of the Rf shield 118 the treatment compartment e.g. defined between the treatment sources 110 and respective substrate carriers 108 are mutually separated or shielded with respect to Rf field, but are within a common vacuum atmosphere, possibly with a slight pressure difference across the grids 114.

Figure 15:
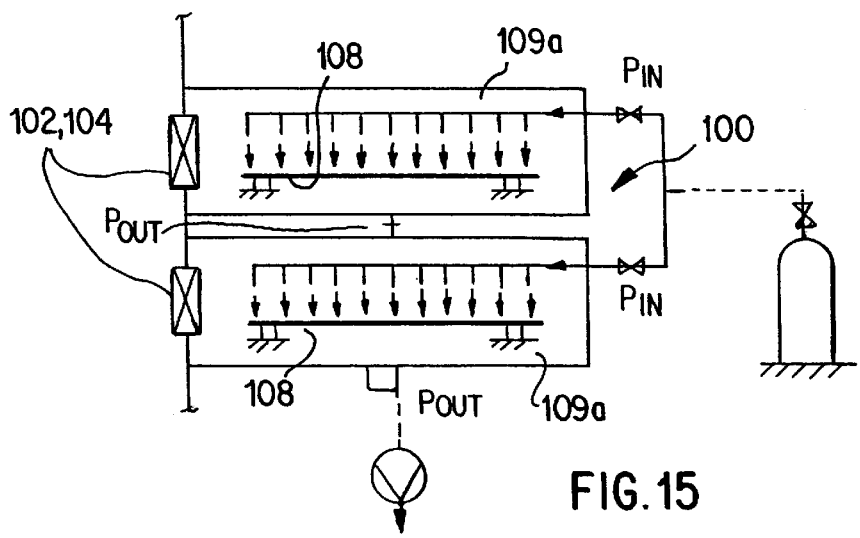
FIGS. 15 to 17 schematically, three embodiments of treatment stations as incorporated in the inventive apparatus, different with respect to process atmosphere encapsulation.
Figure 16:
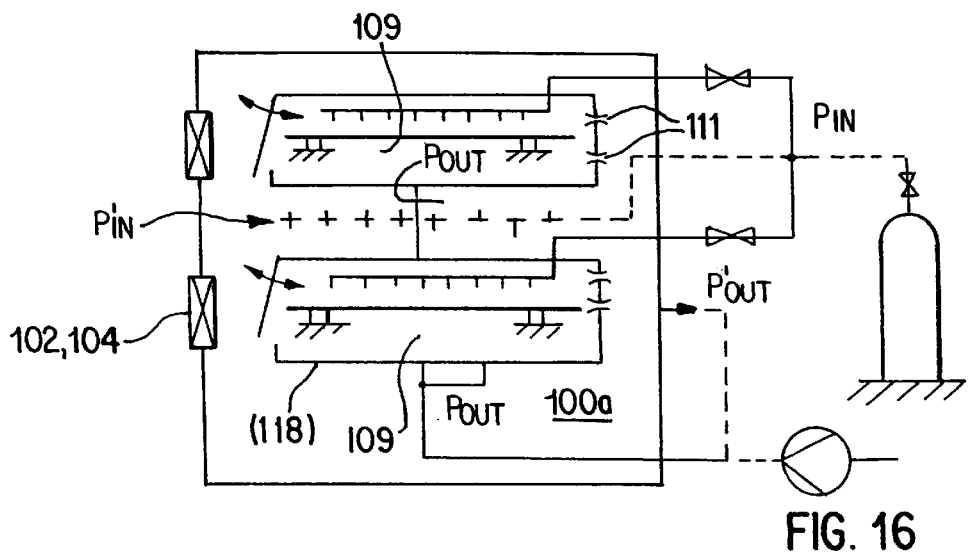
Figure 17:
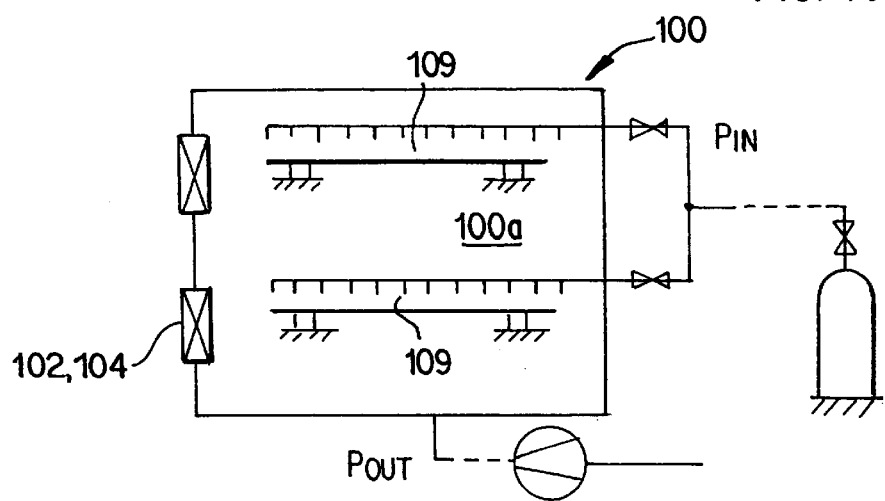

In the FIGS. 15 to 17 schematically the different embodiments of construing treatment chamber 100 are schematically shown. According to FIG. 15 the treatment station 100 comprises a number, as shown e.g. two, per se vacuum-tight treatment chambers 109a, each respectively with a substrate carrier 108, the handling opening with valve 102, 104 and (not shown) possibly a treatment source, as e.g. an electrode arrangement according to 110 of FIG. 10.

According to FIG. 16, which principally accords to the preferred embodiments according to the FIGS. 10 to 12, the treatment station 100 comprises the common vacuum chamber 100a, therein treatment compartments 109 with respective carriers 108 and, if required, treatment sources, as electrode arrangement 110 of FIG. 10. The compartments 109 are separated from the vacuum atmosphere in chamber 100a by means of pressure stages needed, schematically shown at 111 of FIG. 16, which are, according to FIG. 10, formed on one hand by grids 114 and on the other hand by leakages of Rf shield 118.

In the further embodiment of FIG. 17 the treatment compartments 109 are in open communication with the inside of vacuum chamber 100a.

In the embodiment according to FIG. 15 each treatment chamber 109a comprises preferably a suction port $P_{out}$ and a gas inlet port $P_{in}$. If an electrode arrangement 110 according to FIG. 10 is provided, then the shower-like gas inlet arrangement (see FIG. 10) is provided at the electrode arrangement.

In the embodiment of FIG. 16 both may be realised, i.e. pumping ports $P_{out}$ are provided at least to a number of the compartments 109 and/or not compartment-specific to the inside of the vacuum chamber 100a, see $P'_{out}$.

The same is valid for a gas inlet port $P_{IN}$, which is provided at least to some of the compartments 109 and/or compartment-unspecifically to the vacuum chamber 100a, $P'_{IN}$.

In the embodiment of FIG. 17 a pumping port $P_{out}$ and a gas inlet port $P_{in}$ are provided, either treatment compartment-unspecifically to the chamber 100a (not shown) and/or specifically to the compartments 109, which may especially be valid for gas inletting adjacent to substrates on the carriers 108.

As especially shown in FIGS. 11 and 12 the treatment station 100 may be of rectangular or square shape. Nevertheless, this treatment station may more generically be of a polygon shape, thereby more preferred has the shape of a polygon with an even number of sides, thereby even more preferred has the shape of a four-sided polygon, in most preferred form as was said has a rectangular or even square shape.

Now turning to the transport chamber 106. It might be seen that it again comprises a robot 120 rotatable by means of a drive motor arrangement 122 around a vertical axis Z substantially in the centre of the transport chamber 106. The robot comprises, as seen in FIG. 10, two substrate supports 124, which are stacked one upon the other in vertical alignment and horizontally substantially aligned with the openings 102 and the substrate carriers 108 in the treatment chamber 100. As may be seen in FIG. 11 these substrate supports 124 are respectively construed of two horizontally distant support bars 124a and b, which are attached to a vertical support frame 126. The support frame 126 is linked to the central rotating part 120a of the robot 120 by means of a pair of two-lever arrangements 128a and 128b. One first lever of each pair is drivably linked pivotably around a vertical axis to the central part 120a of the robot 120, the second lever of each pair is pivotably linked to the frame 126, as shown in FIG. 11. The respective first and second levers are mutually pivotably linked. The respective pairs of levers form horizontally movable elbow articulations.

Thereby, an important fact is that the bars 124a and b and more generically the workpiece supports 124 are positioned from the frame 126 towards the rotational axis Z of the robot in the horizontally retracted position, shown in FIG. 11. This layout of the robot 120 within transport chamber 106 allows for lowest possible space for accommodating the robot 120, which nevertheless must be able to completely penetrate into the treatment station 100 and—as will be explained later—into further stations coupled to the transport chamber 106, so as to deposit or remove substrates 130, as especially shown in FIG. 11.

In one preferred embodiment of the inventive apparatus as shown in the FIGS. 10 to 12, the robot 120 comprises a given number of substrate supports 124, and accordingly the treatment station 100 comprises the same number of horizontally aligned treatment stations or treatment compartments.

As will be described in connection with a loadlock chamber arrangement 132, preferably provided at the inventive apparatus and in connection with handling with respect to such loadlock chamber arrangement, it is most advantageous that the supports 124 at the robot 120 may drivingly be lifted and lowered in vertical direction by means of a drive, e.g. integrated in the drive motor arrangement 122 and as shown in FIG. 10 by the double-acting arrow H.

By such movement and in a preferred form the mutual positioning of the supports 124 is left unchanged, i.e. all the supports 124 provided at the robot are lifted or lowered in synchronism. Nevertheless, it may be desired to realise lifting and lowering some of the supports independently from lifting and lowering of others of the supports.

Figure 18:
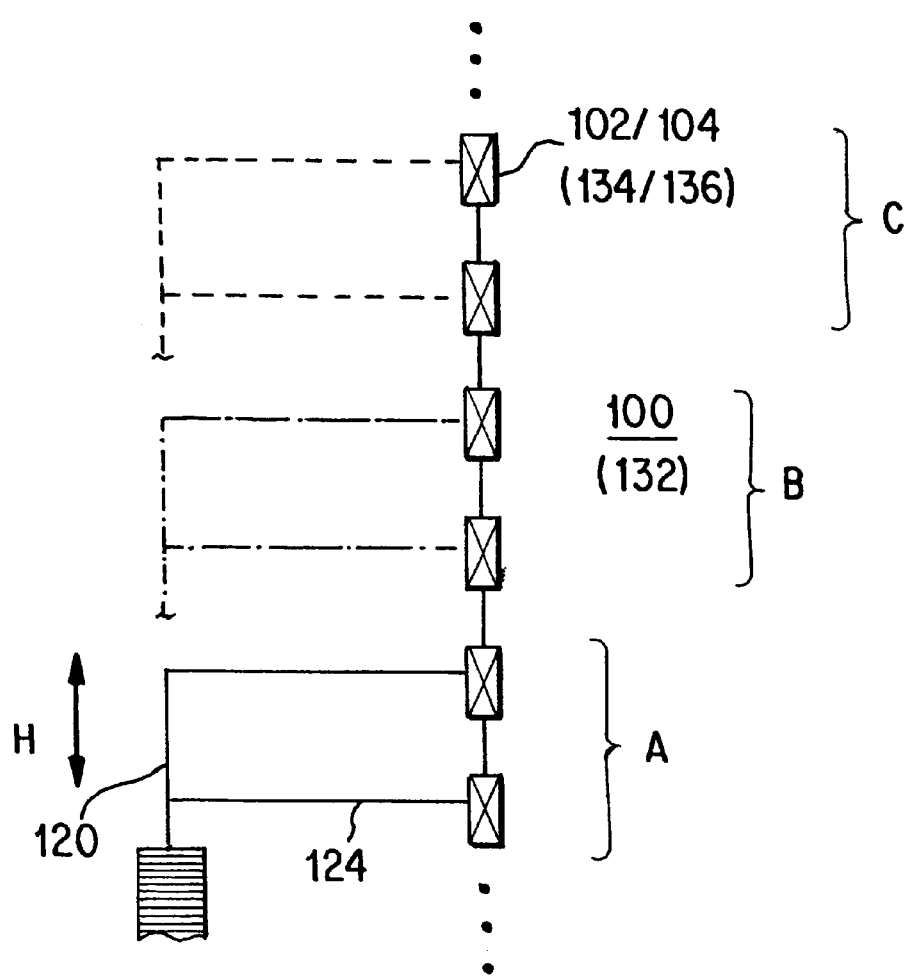
FIG. 18 schematically, a further embodiment of serving a treatment station—and/or loadlock chamber—arrangement by means of the robot incorporated in the inventive apparatus and being vertically expandable and retractable.

Now, if, as preferred, all the supports 124, and according to the preferred embodiment the two supports 124, may be drivingly lifted and lowered according to H, then the treatment station 100 may comprise an integer multiple of carriers 108, treatment chambers or compartments, with respect to the number of supports 124 provided at the robot 120. In such case and as schematically shown in FIG. 18, staggered sets of treatment chambers or treatment compartments, each set having the same number of such chambers or compartments as the number of supports 124, are sequentially served by the robot 120. In FIG. 18 such option is shown on the basis of a two-support robot 120, as shown in FIG. 10.

In schematic form FIG. 18 shows the robot 120 in a first vertical position (solid lines) to serve a first set A of openings 102 according to FIG. 11, then (dashed dotted lines) in a second position to serve a second set B, and finally (broken lines) to serve a third set C etc.

Thus, the transport station 100 comprises an integer multiple of supports provided at the robot 120, thereby in the most preferred form according to FIG. 10 this integer is just unity.

The transport chamber 106 communicates with a loadlock chamber arrangement 132 via two handling openings 134 with respective valves 136, again preferably slit valves. The openings 134 are mutually aligned vertically and, horizontally, are substantially aligned with the substrate supports 124, the openings 102 and the substrate carrier 108.

Although the loadlock chamber arrangement 132 may be construed for accommodating just two substrates for the two substrate processing treatment station 100, in a most preferred embodiment the loadlock chamber arrangement 132 accommodates an integer multiple of substrates with respect to the number of supports 124 at the robot 100. As shown in FIG. 10 preferably the loadlock chamber arrangement 132 may accommodate four substrates 130, placed on respective ones of four substrate carriers 138, stacked in vertical alignment. Their horizontal alignment is so that, pairwise, substrates 130 may horizontally be handled to or from two carriers 138 through one single opening 134. To serve the substrate carriers 138 within the loadlock chamber arrangement 132 the supports 124 may synchronously be vertically moved as was explained and as shown by H and in FIG. 18.

Nevertheless, the supports may also be vertically movable in mutual independence as shown in FIG. 10 by dashed line drive telescope-part 140.

The loadlock chamber arrangement 132 communicates with ambient via two vertically aligned handling openings 142 with respective valves 144. An ambient handling robot 150 (see FIG. 12) which may be construed as the robot within transport chamber 106 is provided for serving the loadlock chamber arrangement 132.

Figure 19:
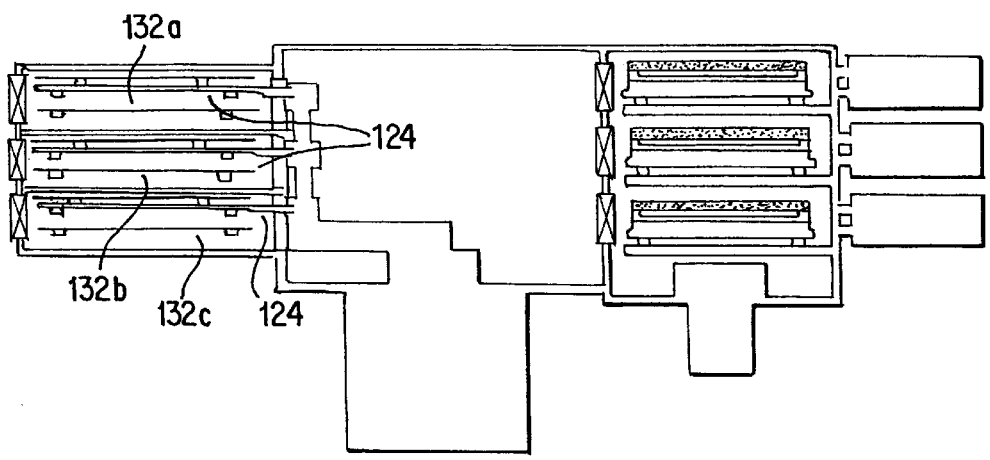
FIGS. 19 to 22 different modifications of the apparatus according to FIGS. 10, 11.
Figure 20:
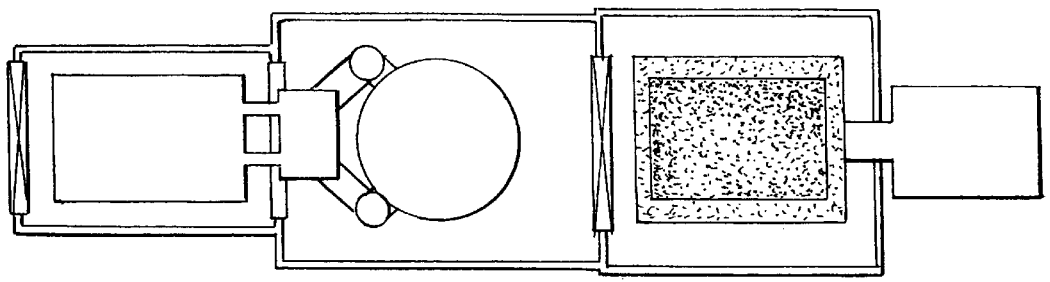
Figure 21:
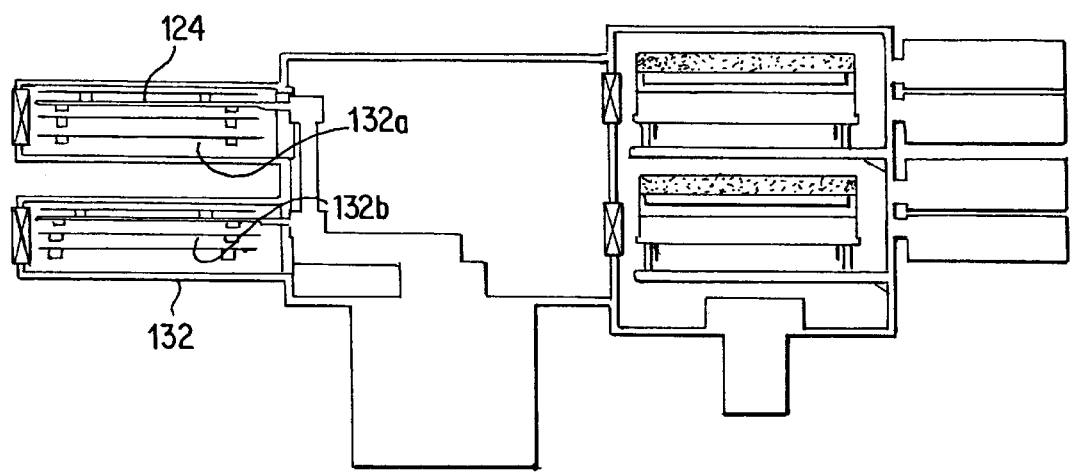
Figure 22:
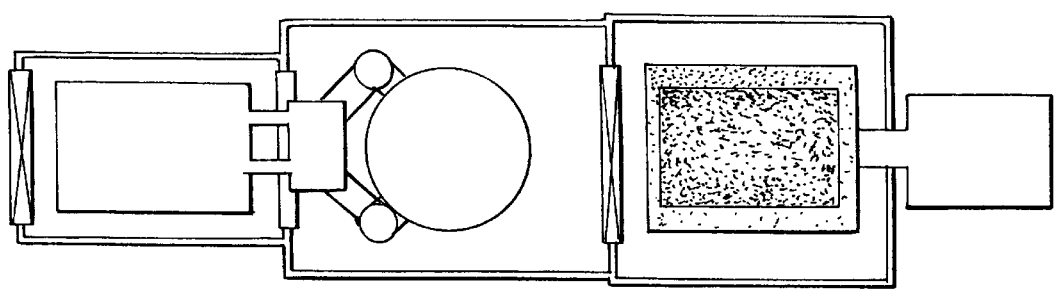

In a preferred embodiment as shown the loadlock chamber arrangement 132 comprises two separately evacuatable (not shown) loadlock chambers 132a and 132b. The embodiment of FIGS. 19 and 20 comprises three such chambers 132a, b, c and a robot 120 with three supports 124. Further, FIGS. 21, 22 show an embodiment with two supports 124, six carriers in loadlock chamber arrangement 132, three per chamber 132a, b.

As will be apparent when considering a process sequence performed at the inventive apparatus and as will be described later on, a most preferred embodiment of the inventive apparatus comprises two separately evacuatable loadlock chambers 132a, 132b, in a more generic view a number of such loadlock chambers 132x, which is equal to the number of supports 124 at the robot 120, which latter number is at least two.

When considering the preferred movability H of the robot it becomes nevertheless clear that in analogy to the representation in FIG. 18, more than two sets of loadlock chambers 132x may be provided, which are served by the robot under different vertical extension according to H. Each set of loadlock chambers has a number of such chambers equal to the number of supports of the robot.

Figure 10A:
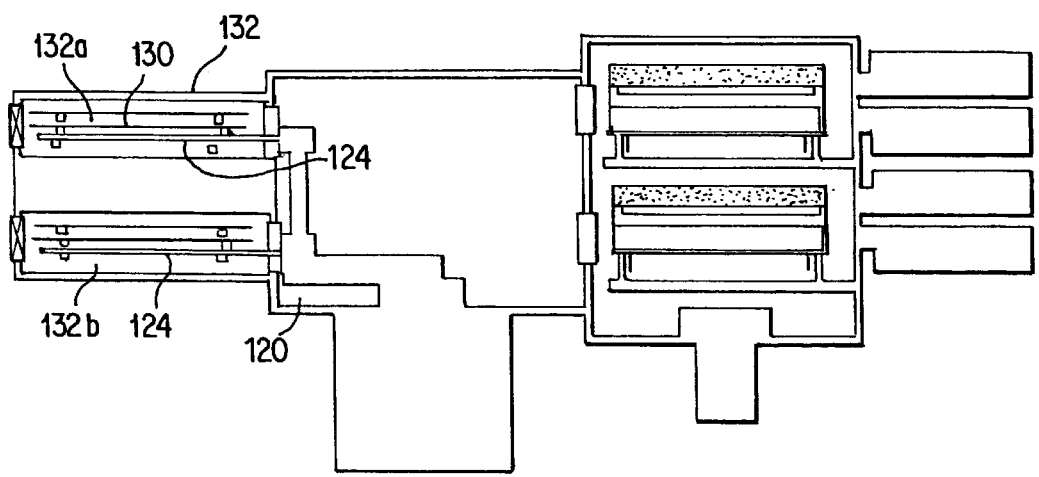
FIGS. 10a to 10c and FIGS. 11a to 11c the embodiment of FIGS. 10, 11 in different operating positions.

Nevertheless, in the most preferred embodiment and as also shown in FIG. 10, each separate loadlock chamber 132x has two substrate carriers 138, served through the same opening 134 with according valve, whereby in some embodiments (see FIGS. 21, 22) more than two such substrate carriers 138 may be provided in some or each of the separately evacuatable loadlock chambers 132x. FIGS. 10a 11a show the apparatus of FIGS. 10, 11 with the robot 120 just having picked up a substrate from each lower carrier 138 of the separate chambers 132a, 132b.

Figure 10B:
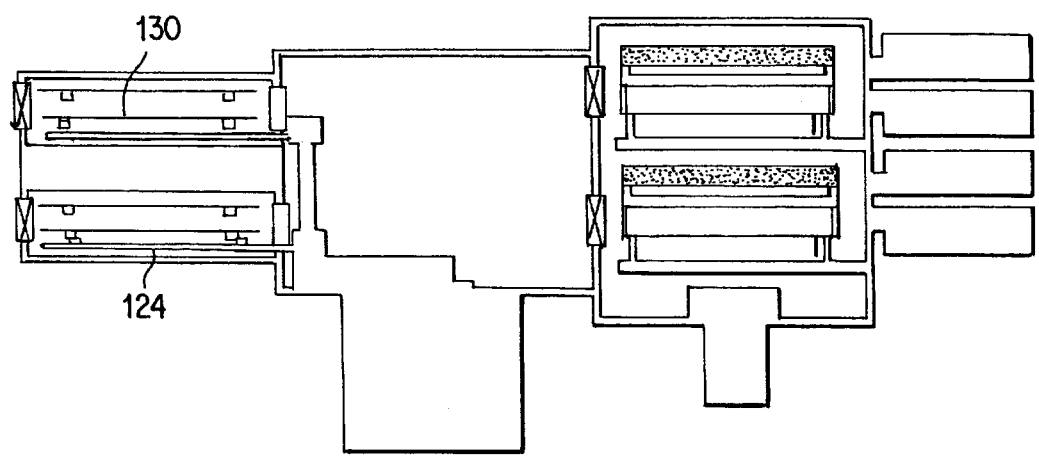

Accordingly, FIGS. 10b and 11b show substrates 130 just having been positioned or just being about to be taken over by the robot 120 in said chambers 132a, 132b.

Figure 10C:
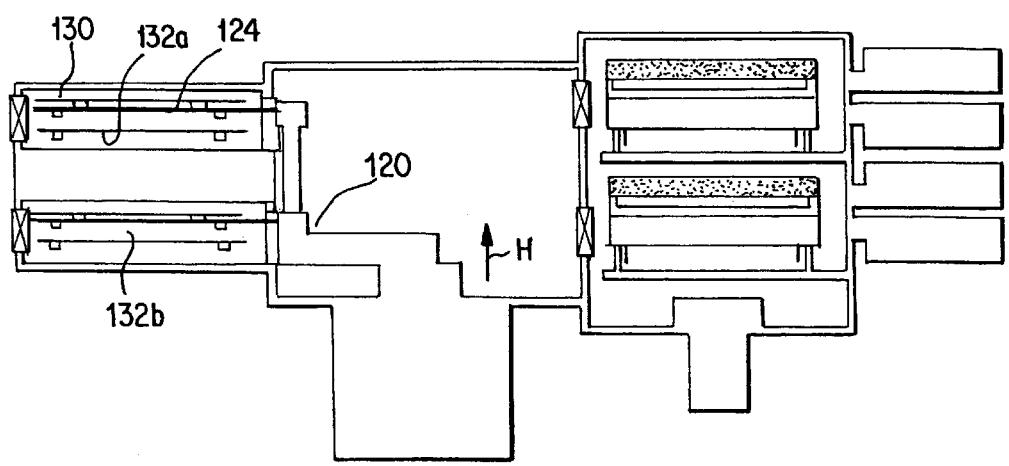

Further, FIGS. 10c and 11c show taking over or replacing substrates 130 at the upper positions of the respective chambers 132a, 132b.

The apparatus is especially construed to handle and treat flat display substrates, thereby especially flat active display substrates, preferably TFT substrates. Such substrates are preferably rectangular and of large dimension of at least 30×30 cm. As the treatment station 100, also the transport chamber 106 and the loadlock chamber arrangement 132 are preferably rectangular in cross-section, as shown in FIG. 11 and FIG. 12, so that—and according to FIG. 12—one, two or three treatment stations 100 for respective processes may be flexibly grouped in a 90° symmetric arrangement and most compact around the square-shaped transport chamber 106.

Nevertheless, and was already explained with respect to the treatment station 100, the transport chamber 106 as well as the loadlock chamber arrangement 132 may be polygon-shaped, have the shape of a four-sided polygon, as was already said, preferably a rectangular or square shape.

In the treatment station 100 provided as shown in FIG. 10, two equal treatment processes are performed simultaneously, i.e. in parallel. If two or more than two of the treatment stations are grouped around the transport chamber 106, as shown in FIG. 12 e.g. three treatment stations 100, different processes may be performed at different treatment stations 100 or equal processes all along two or more than two of the treatment stations 100.

If, according to FIG. 18, more than one set of treatment chambers or treatment compartments are provided at one treatment station 100 considered, whereby each set comprising the same number of substrate carriers 108 as the number of supports 124 at the robot, then it is possible again to operate equal processes in all the stapled sets A, B, C according to FIG. 18, or to operate different processes thereat, whereby serving of the different sets is adapted to the time extent of the processes respectively performed at the different sets A, B, C. It must be pointed out that instead of or additionally to driven robot movability H the respective chamber arrangements 132 and/or 100 necessitating such relative movability could drivingly be moved, H' and H" in FIG. 10.

When operating the inventive apparatus a primary object is to optimise substrate throughput.

Figure 13:
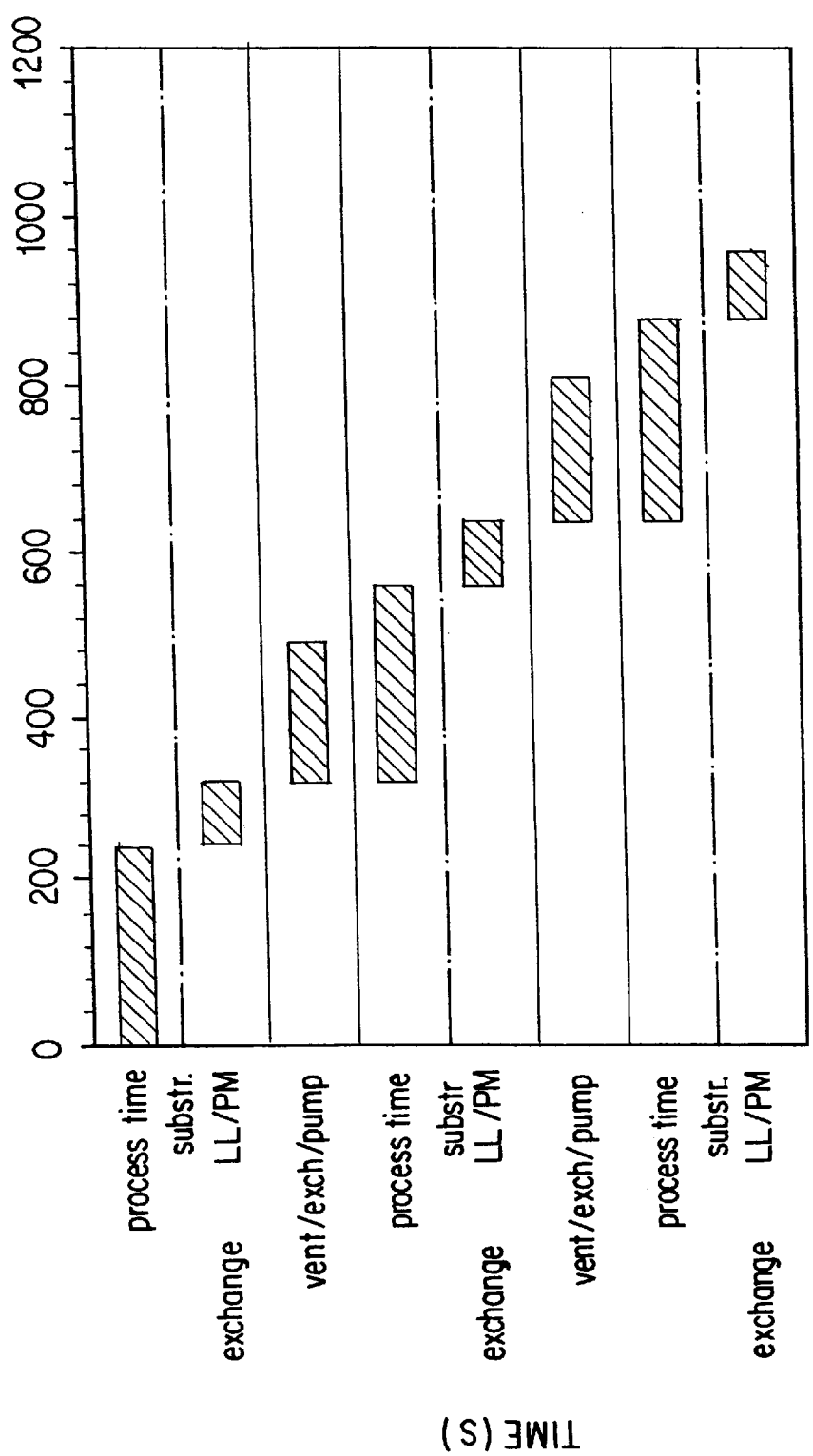
FIG. 13 a preferred processing diagram of substrate processing in the apparatus of FIG. 12 in minimal configuration.

In FIG. 13 process time sequences are shown for processing flat panel substrates as especially TFT display substrates in an apparatus as explained with the help of the FIGS. 10 to 12 with one treatment station 100 provided. Thereby, the following assumptions are made:

| | |
|---|---|
| Processing time in treatment station 100: | 240 sec. |
| Exchanging substrates between transport chamber 106, treatment station 100 and loadlock chamber arrangement 132: | 80 sec. |
| Venting, exchanging substrates with ambient and pumping down loadlock chamber arrangement 132: | 170 sec. |

FIG. 13 reveals that processing at the inventive apparatus is only interrupted during the relatively short 80 sec. time span for exchanging the substrates between transport chamber 106 and, respectively, treatment station 100 and loadlock chamber arrangement 132.

In FIG. 14(a) the processing sequence is shown as preferably performed with the apparatus of FIG. 12 with one treatment station and for a relatively short process. FIG. 14(b) shows the preferred processing sequence for a longer process, thereby performing the same process at two treatment stations 100. Still further, FIG. 14(c) analogically shows processing with the apparatus of FIG. 12 for even longer processes with three treatment stations 100. Thus, the throughput can be maintained or even enhanced also for longer processes depending on the chosen number of parallel-working process stations and thus in fact of supports at the robot 120. An example of a preferred processing sequence is performed as follows:

Substrate Loading

1. First apparatus has to reach main state stand-by where all vacuum chambers are pumped down, all components are initialised and all chamber valves are closed.
2. Loadlock chambers 132a, b are vented to ambient.
3. Loadlock valves 144 to ambient open for loading substrates.
4. Substrate loading in lower positions 138 of the loadlock chambers 132a, b is performed.
5. Loadlock valves 144 to ambient close.
6. Loadlock chambers 132a, b are pumped down to vacuum.

7. All the valves 136, 104 of loadlock chambers 132a, b and treatment station towards transport chamber 106 open.
8. Both substrates from lower loadlock chamber positions 138 are loaded in parallel to treatment station 100.
9. Treatment processes in treatment station 100 starts, duration e.g. between 2 and 10 min.

Meanwhile

10. Just after starting processing in station 100 the loadlock chambers 132a, b are vented to ambient ($B_1$).
11. The loadlock to ambient valves 144 open for loading substrates (C).
12. Two substrates are loaded in lower position 138 of each loadlock chamber 132a, b (C).
13. Loadlock to ambient valve 144 close (C).
14. Loadlock chambers 132a, b are pumped down to vacuum ($B_2$)

Internal exchange (1.5 min.):

At the end of processing (D) in treatment station 100 and after termination of down-pumping loadlock chamber 132a, b ($B_2$)

15. all the valves 134, 104 towards the transport chamber 106 are open (A).
16. Both processed substrates are parallel unloaded from the treatment station 100 and handled to the empty loadlock upper carriers 138 (A).
17. Both unprocessed substrates on the lower loadlock chamber carriers 138 are parallel loaded from the loadlock 132 a, b to the treatment station 100 (A).
18. Process starts, and loadlock chambers again vent ($B_1$) to ambient (1 min.) for external exchange.

External Exchange (3 to 4 min.)

19. Loadlock to ambient valve 144 open (C).
20. Processed substrates are unloaded from the loadlock 132a, b to ambient.
21. Two unprocessed substrates are loaded into the loadlock 132a, b from ambient (C).
22. Loadlock to ambient valves closed (C).
23. Loadlock chambers 132a, b are pumped to vacuum (1 min.), ($B_1$)

The two loadlock chambers 132a and b are thus connected and operated synchronously. As soon as processing is terminated, the loadlocks are practically ready for an internal transport chamber/loadlock exchange which keeps the process interruption as shown in FIG. 13 optimally short.

Figure 14:
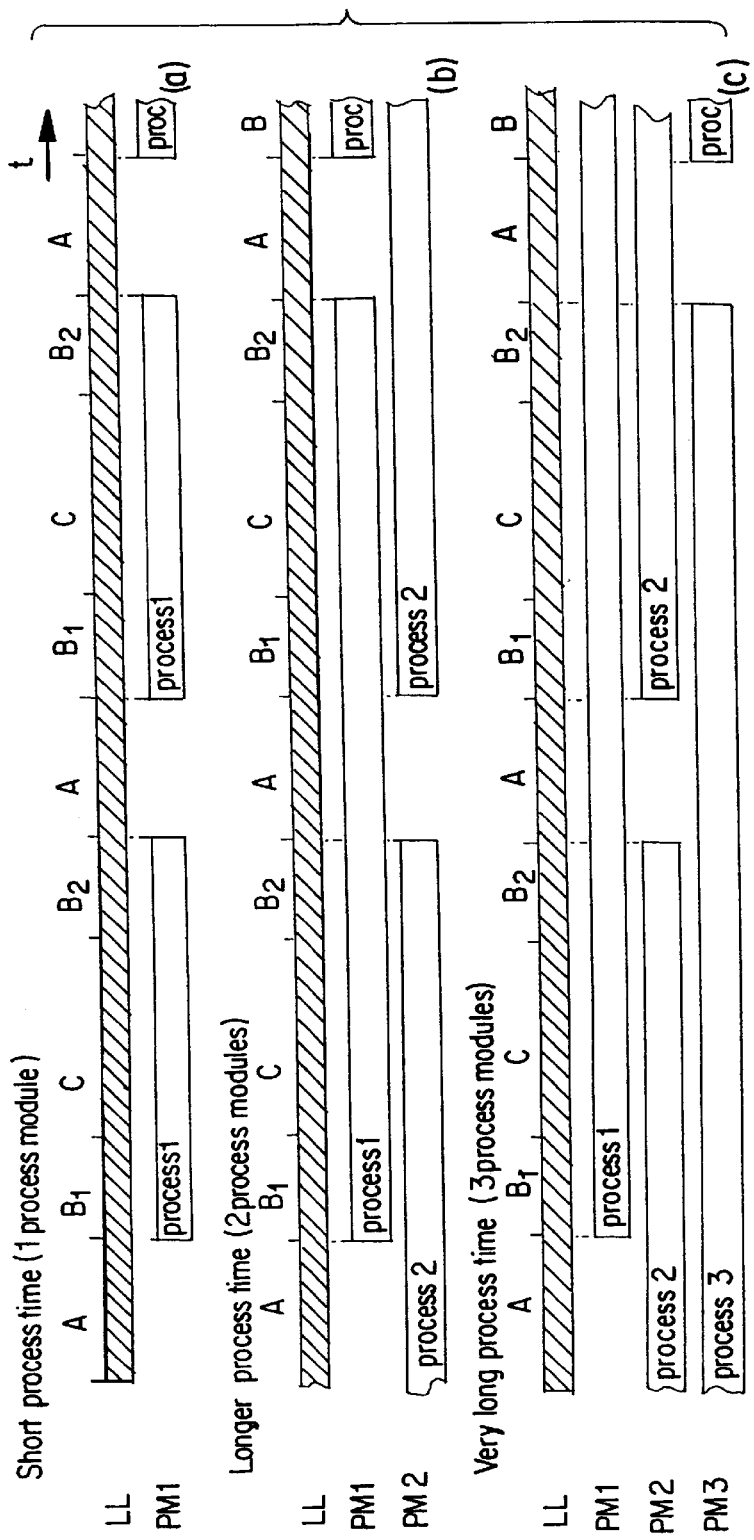
FIG. 14 processing time sequences for short up to very long processes and as realised with the inventive apparatus according to FIG. 12.

By the especially preferred apparatus according to the FIGS. 10 to 12 and its preferred processing according to FIGS. 13 and 14 extremely high throughput, high flexibility of configuration, low apparatus and manufacturing costs are reached with an apparatus requiring very simple external ambient robot handling and having an extremely small footprint. The apparatus is especially tailored for manufacturing flat panel displays, as TFT panels.

Having understood construction and operating of the inventive apparatus, it must be emphasised that the concept of providing separate loadlock chambers 132x at the loadlock chamber arrangement 132, each thereof with independently controllable valves 144 to their respective handling openings 142 and 134, 136 makes it possible to float and to evacuate the respective loadlock chambers 132x independently from each other. This leads to realisation of an optimum interface between ambient substrate handler, which may be a single substrate handler as shown at 150 of FIG. 12, to the parallel processing, i.e. batch processing, in the inventive apparatus. Thus, in a preferred embodiment each of the separate loadlock chambers 132x comprises respective pumping port, which are connected either to separate pumping arrangements or, via switch valves, to a number of pumping arrangements, which is smaller than the number of loadlock chambers provided.

What is claimed is:

1. A method of operating an apparatus for vacuum plasma treatment comprising:

providing at least one treatment station with at least two substrate carriers stacked one above the other and in vertical alignment, further with at least two sealably closable handling openings vertically in mutual alignment and substantially horizontally aligned with respective ones of said at least two carriers, a transport chamber communicating with said station via said handling openings and comprising a transport robot drivingly rotatable around a vertical axis in said transport chamber and comprising at least two substrate supports being vertically aligned and extending horizontally and substantially aligned with said at least two carriers respectively and being radially movable with respect to said axis, wherein, the step of interrupting processing at said at least one treatment station just for handling at least two substrates in parallel to or from said transport chamber.

2. A method for manufacturing flat, plasma-treated substrates comprising:

(a) providing at least one treatment station with at least two substrate carriers stacked one above the other and in vertical alignment;

(b) providing for said treatment station at least two sealably closable handling openings vertically in mutual alignment and substantially horizontally aligned with respective ones of said at least two substrate carriers;

(c) providing a transport chamber communicating with said station via said handling openings;

(c2) providing a transport robot drivingly rotatable around a vertical axis in said transport chamber;

(d) providing at least two substrate supports on said transport robot, said supports being vertically staggered and being radially movable with respect to said axis;

(e) depositing at least one substrate on one of said at least two substrate supports;

(f) rotating aid transport robot to bring said support in alignment with one of said at least two handling openings;

(g) radially moving said support through said opening;

(h) depositing said substrate on one of said at least two substrate carriers;

(i) sealingly closing said one of said at least two sealably closable handling openings;

(j) plasma-treating said substrate within said treatment station; and (k) removing aid plasma-treated substrate from said treatment station.

3. The method of claim 2, further comprising providing within said treatment station at least two vacuum-tight separated treatment chambers, each respectively with one of said substrate carriers and of said handling openings.

4. The method of claim 2, further comprising providing within said treatment station at least two treatment compartments within a common vacuum chamber and providing open communication or pressure stage communication of said treatment compartments with said common vacuum chamber.

5. The method of claim 4, further comprising inletting gas commonly to said at least two treatment compartments and/or commonly retrieving gas from said at least two treatment compartments.

6. The method of claim 4, further comprising inletting gas separately to each of said treatment compartments and/or separately retrieving gas from said at least two treatment compartments.

7. The method of claim 2, further comprising treating simultaneously a number of said substrates in said at least one treatment station, which is equal or an integer multiple of the number of said at least two supports.

8. The method of claim 2, further comprising treating said substrate within said treatment station by means of a two-dimensionally extended electrode distant from and facing said one of said at least two substrate carriers.

9. The method of claim 2, further comprising Rf plasma-discharge treating said workpiece within said treatment station.

10. The method of claim 2, further comprising treating said substrate within said treatment station by means of a plasma and supplying said plasma by a supply generator arrangement mounted on said treatment station.

11. The method of claim 2, further comprising inletting gas into said treatment arrangement and retrieving gas from said treatment station.

12. The method of claim 2, further comprising providing at least two vacuum-tight separated treatment chambers within said treatment station each respectively with one of said substrate carriers and of said handling openings, thereby separately inletting gas into each of said treatment chambers and/or separately retrieving as from said at least two treatment chambers.

13. The method of claim 2, further comprising the step of providing more than two of said substrate carriers and of said handling openings.

14. The method of claim 2, further comprising feeding said at least one substrate towards and/or from said robot via a loadlock arrangement.

15. The method of claim 2, further comprising the step of simultaneously transporting a first number of substrates and simultaneously treating a second number of substrates and thereby selecting said second number to be an integer multiple of said first number.

16. The method of claim 2, further comprising the step of simultaneously treating a first number of substrates and simultaneously transporting a second number of substrates and thereby selecting said second number to be an integer multiple of said first number.

17. The method of claim 2, further comprising feeding at least two substrates in vertical alignment and via a loadlock station towards and/or from said robot.

18. The method of claim 2, further comprising conveying said at least one substrates vertically to feed said workpiece towards and/or from said one opening.

19. The method of claim 2, further comprising readying a first number of said substrates in a loadlock and catching a second number of said substrates by said supports, said first number being an integer multiple of said second number or said second number being an integer multiple of said first number.

20. The method of claim 2, further comprising horizontally transporting said substrate in ambient before handling over to said robot.

21. The method of claim 2, wherein said substrate is a substrate of a display panel.

22. The method of claim 2, wherein said substrate is the substrate of an active display panel.

23. The method of claim 2, wherein said substrate is a substrate of a TFT display.

24. The method of claim 2, wherein said substrate is at least 30 cm×30 cm.

25. The method of claim 2, further comprising treating said substrate subsequently in at least two of said treatment stations.

26. The method of claim 2, further comprising treating subsequently said substrate on at least two of said substrate carriers.

27. The method of claim 2, further comprising said treating said at least one substrate comprising Rf dry etching.

* * * * *